(12) United States Patent
Ling et al.

(10) Patent No.: US 8,758,935 B2
(45) Date of Patent: Jun. 24, 2014

(54) SOLUBLE POLYMER WITH MULTI-STABLE ELECTRIC STATES AND PRODUCTS COMPRISING SUCH POLYMER

(75) Inventors: Qi-Dan Ling, Singapore (SG); Jian Zhu, Singapore (SG); Chunxiang Zhu, Singapore (SG); Daniel Siu-Hung Chan, Singapore (SG); En-Tang Kang, Singapore (SG); Koon-Gee Neoh, Singapore (SG)

(73) Assignee: National University of Singapore, Singapore (SG)

( * ) Notice: Subject to any disclaimer, the term of this patent is extended or adjusted under 35 U.S.C. 154(b) by 148 days.

(21) Appl. No.: 13/148,022

(22) PCT Filed: Feb. 4, 2010

(86) PCT No.: PCT/SG2010/000039
§ 371 (c)(1),
(2), (4) Date: Aug. 4, 2011

(87) PCT Pub. No.: WO2010/090603
PCT Pub. Date: Aug. 12, 2010

(65) Prior Publication Data
US 2011/0294976 A1    Dec. 1, 2011

Related U.S. Application Data

(60) Provisional application No. 61/202,187, filed on Feb. 4, 2009.

(51) Int. Cl.
H01M 4/02 (2006.01)
H01M 10/18 (2006.01)
H01M 6/48 (2006.01)
C08G 61/10 (2006.01)

(52) U.S. Cl.
USPC ........... 429/209; 429/210; 528/422; 528/425; 528/491; 528/497

(58) Field of Classification Search
USPC ........... 528/422, 425, 491, 497; 429/209, 210
See application file for complete search history.

(56) References Cited

U.S. PATENT DOCUMENTS 7,557,372 B2    7/2009  Yang et al.
2006/0211257 A1   9/2006  Halik et al.

FOREIGN PATENT DOCUMENTS

WO   WO 2005/100466 A1   10/2005

OTHER PUBLICATIONS

Moroni et al; Rigid rod—derivatives; Macromolecules, 1994, vol. 27, pp. 562-571.*

(Continued)

Primary Examiner — Duc Truong
(74) Attorney, Agent, or Firm — Wolf, Greenfield & Sacks, P.C.

(57) ABSTRACT

A compound comprises a polymeric chain with a repeat unit repeated more than 5 times. The repeat unit comprises conjugated first and second cyclic groups and a plurality of side groups each bonded to one of the cyclic groups. A side group bonded to the first cyclic group is an electron donor and a side group bonded to the second cyclic group is an electron acceptor, such that the compound is switchable between first and second electrical conductive states by application of an electric field to the compound. At least one of the side groups is selected so that the compound is soluble in an organic solvent. The compound may be used in films, memory cells, or electronic devices. A layer of the compound may be formed on a surface by dissolving the compound in an organic solvent, applying the solution to the surface, and then removing the solvent.

20 Claims, 16 Drawing Sheets

PPE-a

PPE-b

PPE-c

PPE-d

(56) References Cited

OTHER PUBLICATIONS

International Search Report and Written Opinion, mailed Mar. 16, 2010, in related PCT patent application No. PCT/SG2010/000039.
International Preliminary Report on Patentability, dated Jul. 5, 2010, in related PCT patent application No. PCT/SG2010/000039.
Ashwell et al., "Organic rectifying junctions from an electron-accepting molecular wire and an electron-donating phthalocyanine", Chem. Commun., 2006, vol. 15, pp. 1640-1642.
Bandyopadhyay et al., "Tuning of Organic Reversible Switching via Self-Assembled Supramolecular Structures", Adv. Mater., 2003, vol. 15, pp. 1949-1952.
Bunz, "Poly(aryleneethynylene)s: Synthesis, Properties, Structures, and Applications", Chem. Rev., 2000, vol. 100, pp. 1605-1644.
Burroughes et al, "Light-emitting diodes based on conjugated polymers", Nature, 1990, vol. 347, pp. 539-541.
Chen et al., "Large On-Off Ratios and Negative Differential Resistance in a Molecular Electronic Device", Science, 1999, vol. 286 (5444), pp. 1550-1552.
Chu et al., "Organic Donor-Acceptor System Exhibiting Electrical Bistability for Use in Memory Devices", Adv. Mater., 2005, vol. 17, pp. 1440-1443.
Fang et al., "New π-conjugated polyaryleneethynylenes containing a 1,3,5-triazine unit in the main chain: synthesis and optical and electrochemical properties", J. Polym. Sci. Part A—Polym. Chem., 2006, vol. 44, pp. 3797-3806.
Forrest, "The path to ubiquitous and low-cost organic electronic appliances on plastic", Nature, 2004, vol. 428, pp. 911-918.
Garnier et al., "All-polymer field-effect transistor realized by printing techniques", Science 1994, vol. 265, pp. 1684-1686.
Gergel et al., "Study of the room temperature molecular memory observed from a nanowell device", J. Vacum. Sci. & Tech. A, 2005, vol. 23, pp. 880-885.
Gergel-Hackett, "Effects of molecular environments on the electrical switching with memory of nitro-containing OPEs", J. Vacum. Sci. & Tech. A, 2006, vol. 24, pp. 1243-1248.
Goto et al., "Electron-Induced Switching of the Supramolecular Chirality of Optically Active Polythiophene Aggregates", J. Am. Chem. Soc., 2002, vol. 124, pp. 7943-7949.
Granstrom et al., "Laminated fabrication of polymeric photovoltaic diodes", Nature, 1998, vol. 395, pp. 257-260.
Hwang et al., Combinatorial synthesis of oligo(phenylene ethynylene)s, Tetrahedron, 2002, vol. 58, pp. 10387-10405.
James et al., "Electrical measurements in molecular electronics", Chem. Mater., 2004, vol. 16, pp. 4423-4435.
Klemm et al., "Organometallic PAEs", in Poly(arylene etynylene)s, Advances in Polymer Science, 2005, vol. 177, 53-90.
Koishi et al., "Synthesis and nonlinear optical properties of 1,3- and 1,4-disubstituted type of poly(phenyleneethynylene)s containing electron-donor and acceptor group", Macromol. Chem. Phys., 2000, vol. 201, pp. 525-532.
Kumai et al., "Current-induced insulator-metal transition and pattern formation in an organic charge-transfer complex", Science, 1999, vol. 284, pp. 1645-1647.
Lee et al., "Soluble Electroluminescent Poly(phenylene vinylene)s with Balanced Electron- and Hole Injections", J. Am. Chem. Soc., 2001, vol. 123, pp. 2296-2307.
Li et al., "Fabrication approach for molecular memory arrays", Appl. Phys. Lett., 2003, vol. 82, pp. 645-647.
Ling et al., "Non-Volatile Polymer Memory Device Based on a Novel Copolymer of N-Vinylcarbazole and Eu-Complexed Vinylbenzoate", Adv. Mater., 2005, vol. 17, pp. 455-459.
Ling et al., "Synthesis and Dynamic Random Access Memory Behavior of a Functional Polyimide", J. Am. Chem. Soc., 2006, vol. 128, pp. 8732-8733.
Liu et al., "Molecular memories that survive silicon device processing and real-world operation", Science, 2003, vol. 302, pp. 1543-1545.
Mantooth et al., "Fabrication, assembly, and characterization of molecular electronic components", Proc. IEEE, 2003, vol. 91, pp. 1785-1802.
McCullough et al., "Self-orienting head-to-tail poly(3-alkylthiophenes): new insights on structure-property relationships in conducting polymers", J. Am. Chem. Soc., 1993, vol. 115, pp. 4910-4911.
Moller et al., "A polymer/semiconductor write-once read-many-times memory", Nature, 2003, vol. 426, pp. 166-169.
Moller et al., "Electrochromic conductive polymer fuses for hybrid organic/inorganic semiconductor memories", J. Appl. Phy., 2003, vol. 94, pp. 7811-7819.
Morikita et al., "New Charge Transfer-Type π-Conjugated Poly(aryleneethynylene) Containing Benzo[2,1,3]thiadiazole as the Electron-Accepting Unit", Adv. Mater., 2001, vol. 13, pp. 1862-1864.
Moroni et al., "Rigid Rod Conjugated Polymers for Nonlinear Optics. 1. Characterization and Linear Optical Properties of Poly(aryleneethynylene) Derivatives", Macromolecules, 1994, vol. 27, pp. 562-571.
Moroni et al., "Rigid rod conjugated polymers for nonlinear optics. 3. intramolecular H bond effects on poly(phenyleneethynylene) chains", Macromolecules, 1997, vol. 30, pp. 1964-1972.
Ouyang et al., "Programmable polymer thin film and non-volatile memory device", Nat. Mater., 2004, vol. 3, pp. 918-922.
Prakash et al., "Polymer memory device based on conjugated polymer and gold nanoparticles", J. Appl. Phy., 2006, vol. 100, 054309.
Pugh et al., "Phase transfer Pd(O) catalyzed polymerization reactions. I. Synthesis of 1,2-(4,4';-dialkoxyaryl) acetylene monomers and 1,4-Bis[2-(4',4"-dialkoxyphenypethynyl]benzene derivatives by phase transfer Pd(O)/Cu(I) catalyzed coupling reactions", J. Polym. Sci., Part A: Polym. Chem., 1990, vol. 28, pp. 1101-1126.
Raymo, "Digital Processing and Communication with Molecular Switches", Adv. Mater., 2002, vol. 14, pp. 401-414.
Reed et al., "Molecular random access memory cell", Appl. Phys. Lett., 2001, vol. 78, pp. 3735-3737.
Roth et al., One-Dimensional Metals: Conjugated Polymers, Organic Crystals, Carbon Nanotubes, 2004, pp. 38-41, Wiley-VCH: Weinheim.
Saxena et al., "Prospects of conducting polymers in molecular electronics", Curr. Appl. Phy., 2003, vol. 3, pp. 293-305.
Seminario et al., "Theoretical Interpretation of Conductivity Measurements of a Thiotolane Sandwich. A Molecular Scale Electronic Controller", J. Am. Chem. Soc., 1998, vol. 120, pp. 3970-3974.
Seminario et al., "Theoretical Study of a Molecular Resonant Tunneling Diode", J. Am. Chem. Soc., 2000, vol. 122, pp. 3015-3020.
Sirringhaus et al., "Two-dimensional charge transport in self-organized, high-mobility conjugated polymers", Nature, 1999, vol. 401, pp. 685-688.
Sonogashira et al., "A convenient synthesis of acetylenes: catalyiic substitutions of acetylenic hydrogen with bromoalkenes, iodoarenes, and bromopyridines", Tetrahedron Lett., 1975, vol. 50, pp. 4467-4470.
Stikeman, "Polymer memory", Technol. Rev., 2002, vol. 105, p. 31.
Taylor et al., "Memory effect in the current-voltage characteristic of a low-band gap conjugated polymer", J. Appl. Phys., 2001, vol. 90, 306.
Tessler et al., "Lasing from conjugated-polymer microcavities", Nature, 1996, vol. 382, pp. 695-697.
Tiwari et al., "A silicon nanocrystals based memory", Appl. Phys. Lett., 1996, vol. 68, pp. 1377-1379.
Tseng et al., "Polyaniline Nanofiber/Gold Nanoparticle Nonvolatile Memory", Nano Lett., 2005, vol. 5, pp. 1077-1080.
Voskerician et al., "Electronic Properties of PAEs", in Poly(arylene etynylene)s, Advances in Polymer Science, 2005, vol. 177, pp. 209-248.
Yamamoto et al., "Extensive Studies on π-Stacking of Poly(3-alkylthiophene-2,5-diyl)s and Poly(4-alkylthiazole-2,5-diyl)s by Optical Spectroscopy, NMR Analysis, Light Scattering Analysis, and X-ray Crystallography", J. Am. Chem. Soc., 1998, vol. 120, pp. 2047-2058.
Yamamoto et al., "New Soluble Poly(aryleneethynylene)s Consisting of Electron-Accepting Benzothiadiazole Units and Electron-Do-

(56) References Cited

OTHER PUBLICATIONS nating Dialkoxybenzene Units. Synthesis, Molecular Assembly, Orientation on Substrates, and Electrochemical and Optical Properties", Macromolecules, 2003, vol. 36, pp. 4262-4267.
Yamamoto, "Synthesis of π-conjugated polymers bearing electronic and optical functionalities by organometallic polycondensation. Chemical properties and applications of the π-conjugated polymers", SynLett., 2003, vol. 4, pp. 425-450.
Yasuda et al., "Synthesis and characterization of new luminescent 1,10-phenanthroline- and pyridine-containing π-conjugated polymers. Their optical response to protic acid, Mn+, and solvents", Macromolecules, 2003, vol. 36, pp. 7513-7519.

* cited by examiner

SOLUBLE POLYMER WITH MULTI-STABLE ELECTRIC STATES AND PRODUCTS COMPRISING SUCH POLYMER

CROSS-REFERENCE TO RELATED APPLICATION

This application is a U.S. National Stage application based on International Application No. PCT/SG2010/000039, filed on Feb. 4, 2010, which claims the benefit of U.S. Provisional Application No. 61/202,187, filed on Feb. 4, 2009, the entire contents of which are incorporated herein by reference in their entirety.

FIELD OF THE INVENTION

The present invention relates generally to polymeric materials with multi-stable electric states and products comprising such materials, and particularly to polymeric materials suitable for use in electronic devices such as memory and switching devices.

BACKGROUND OF THE INVENTION

Oligo(phenylene ethynylene)s and their derivatives (collectively referred to as "OPEs") with bistable electric conductivity states have been formed and found useful in many types of molecular electronics applications including memory devices. It has been reported that memory devices based on OPEs exhibited a typical ON/OFF current ratio in the range of 50-80, and the memory effect lasted for about 15 minutes (see Chen J. et al., *Science,* 1999, vol. 286 (5444), pp. 1550-1552).

SUMMARY OF THE INVENTION

It is desirable to provide alternative or improved polymeric materials that are convenient for use in memory or switching electronic devices.

According to an aspect of the present invention, there is provided a compound. The compound comprises a polymeric chain comprising a repeat unit repeated more than 5 times, such as 8 to 10 times, in the polymeric chain. The repeat unit comprises a first cyclic group and a second cyclic group conjugated to one another and a plurality of side groups each bonded to one of the first and second cyclic groups. A side group bonded to the first cyclic group is an electron donor and a side group bonded to the second cyclic group is an electron acceptor, such that the compound is switchable between a first electrical conductive state and a second electrical conductive state by application of an electric field to the compound. At least one of the plurality of side groups is selected so that the compound is soluble in an organic solvent. At least one of the electron donor and electron acceptor may be soluble in the organic solvent. The electron-donor may comprise an amino (—$NH_2$), hydroxyl (—OH), alkyl amino (—NHR or —$NR_2$), alkyl (—R), alkoxy (—OR), easter (—COOR), aryl, thionyl, or carbazol group, or a derivative thereof, wherein R is an alkyl group comprising 1 to 20 carbon atoms. The electron-acceptor may comprise a nitro, cyano, isocyano, sulfonyl, sulfinyl, halogenated alkyl, formyl, carboxyl, carbonyl, alkyloxycarbonyl, aryloxycarbonyl, 1-tetrazolyl, carbzmoyl, or sulfamoyl group. The compound may comprise a copolymer, which comprises a phenyl monomer comprising a substituent that is an electron-acceptor; and a phenyleneethynylene monomer comprising a side chain that is an alkyl or alkoxy group having 1 to 20 carbon atoms. The alkyl or alkoxy group may have 1 to 13 carbon atoms. The side chain may be an octyloxy, hexyl, octyl, 2-ethylhexyl, decyl, dodecyl, hexyloxy, 2-ethylhexyloxy, decyloxy, or dodecyloxy group. The phenyl monomer may be a p-phenyl or an m-phenyl. The phenyl monomer may further comprise an additional electron-donor. The copolymer may have a number average molar weight (Mn) of more than 2000 g/mol. The organic solvent may be toluene, benzene, xylene, tetrahydrofuran, chloroform, or dichloromethane. The compound may comprise a chain structure represented by

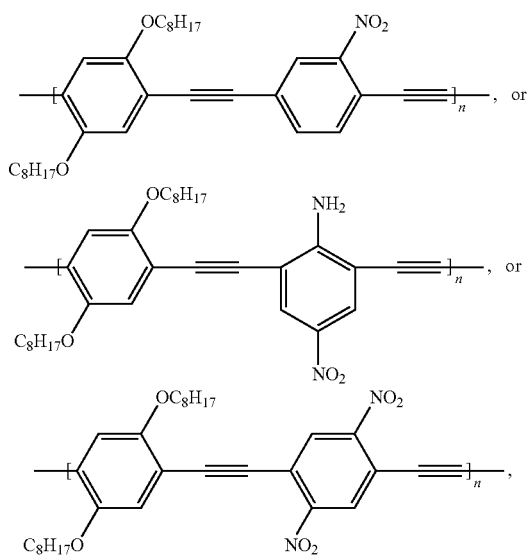

wherein n is an integer greater than 5, such as from 8 to 10 or greater than 10.

According to another aspect of the present invention, there is provided a film comprising a compound described herein.

According to a further aspect of the present invention, there is provided a memory element comprising a compound or film, described herein.

According to another aspect of the present invention, there is provided an electronic device comprising a compound, film, or memory element described herein.

According to a further aspect of the present invention, there is provided a method of forming a film comprising the compound described herein. The method comprises dissolving the compound in an organic solvent to form a solution; applying the solution to a surface to form a layer of the solution on the surface; and removing the solvent from the layer of the solution to form a solid layer comprising the compound on the surface.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures, which illustrate, by way of example only, embodiments of the present invention.

DETAILED DESCRIPTION

Figure 1:
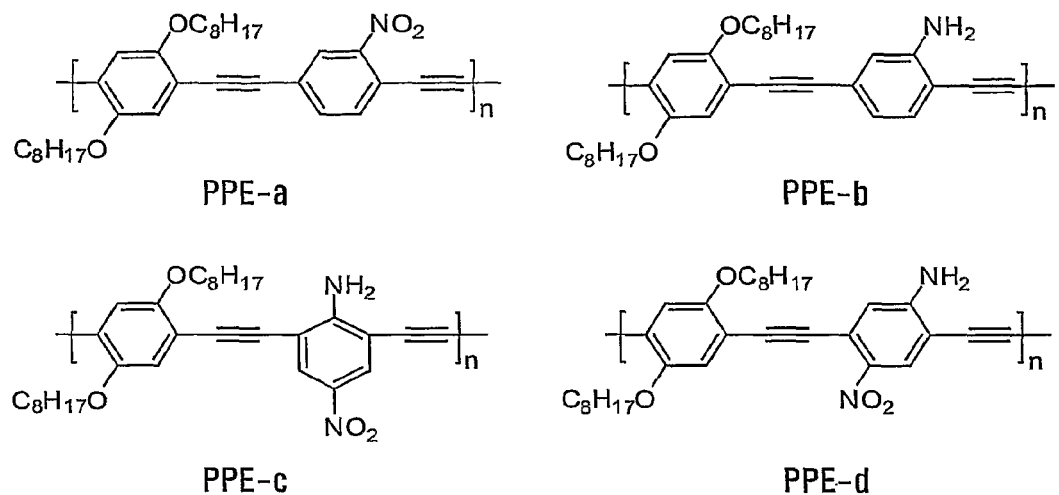
FIG. 1 is a schematic diagram of four different polymeric chain structures, where PPE-a, PPE-c and PPE-d are exemplary of embodiments of the present invention and PPE-b is included for comparison.

An exemplary embodiment of the present invention relates to a compound that includes a copolymer of a phenyl monomer and a phenyleneethynylene (PE) monomer in the main polymer chain. The degree of polymerization of the copolymer is greater than 5, such as greater than 10. The degree of polymerization may be sufficiently high so the number average molar weight (Mn) of the copolymer is greater than 2000 g/mol. The copolymer may be referred to as poly(phenyleneethynylene) (PPE).

The phenyl monomer has a side group substituent that is an electron-acceptor. For example, the phenyl monomer may be a p-phenyl having an electron-accepting substituent. The phenyl monomer may also have an electron-donating substituent. For example, the phenyl monomer may be an m-phenyl having a first substituent that is an electron-donor and a second substituent that is an electron-acceptor. An electron-donor is any group or moiety capable of donating an electron to an electron acceptor. An electron-donor may be an amino (—$NH_2$), hydroxyl (—OH), alkyl amino (—NHR or —$NR_2$), alkyl (—R), alkoxy (—OR), easter (—COOR), aryl, thionyl, or carbazol group, or a derivative thereof, wherein R is an alkyl group having 1 to 20 carbon atoms. An electron-acceptor may be any group or moiety capable of accepting an electron donated by an electron donor. An electron-acceptor may be a nitro, cyano, isocyano, sulfonyl, sulfinyl, halogenated alkyl, formyl, carboxyl, carbonyl, alkyloxycarbonyl, aryloxycarbonyl, 1-tetrazolyl, carbzmoyl, or sulfamoyl group.

The PE monomer has a side chain that is an alkyl or alkoxy group having 1 to 13 carbon atoms and being soluble in an organic solvent, such as toluene, benzene, xylene, tetrahydrofuran, chloroform, or dichloromethane. Two or more side chains of the PE monomer may each be such an alkyl or alkoxy group, which may be independently selected. Conveniently, such side chains may provide improved solubility of the copolymer in the organic solvent, and serve as electron-donors. The side chain may be a hexyl, octyl, 2-ethylhexyl, decyl, dodecyl, hexyloxy, 2-ethylhexyloxy, decyloxy, or dodecyloxy group.

In a specific embodiment, the phenyleneethynylene group has two side chains which are identical and is each a soluble, alkyl or alkoxy group having 1 to 13 carbon atoms.

One or both of the phenyleneethynylene monomer and the phenyl monomer may have an electron donor group. A monomer or a repeat unit in the copolymer may include two or more soluble groups, two or more electron-donor groups, or two or more electron-acceptor groups.

The copolymer may be a linear or branched polymer, and may be an alternative copolymer, a periodic copolymer, a random copolymer, or a block copolymer. In any case, the copolymer should include a sufficient number of side chains formed of an alkyl or alkoxy group having 1 to 20 (such as 1 to 13) carbon atoms, and a sufficient number of electron-donors and electron acceptors, such that the copolymer is soluble in an organic solvent and is reversibly switchable from a first electrical conductive state to a second electrical conductive state by application of an electric field to the compound, When electron donor and acceptor groups are included in different monomer units, the ratio of donor to acceptor in the resulting polymer may be conveniently controlled by adjusting the ratio of one monomer to another monomer in the polymer.

A specific example of the copolymer include a copolymer that has a chain structure represented by the chemical formulae PPE-a, PPE-c, or PPE-d shown in FIG. 1, where "n" is greater than 5, such as greater than 10. The chain structure PPE-b is shown in FIG. 1 as a comparison structure. For convenience of reference, PPE-a, PPE-b, PPE-c, and PPE-d are also used herein to refer to the copolymers having the respective chain structures. As can be appreciated, the octyloxy side chain group in copolymers PPE-a, PPE-b, PPE-c, and PPE-d is soluble in an organic solvent and is an electron donor; the amino (—$NH_2$) group attached to the phenyl group is an electron donor; and the nitro (—$NO_2$) group attached to the phenyl group is an electron-acceptor.

Figure 2:
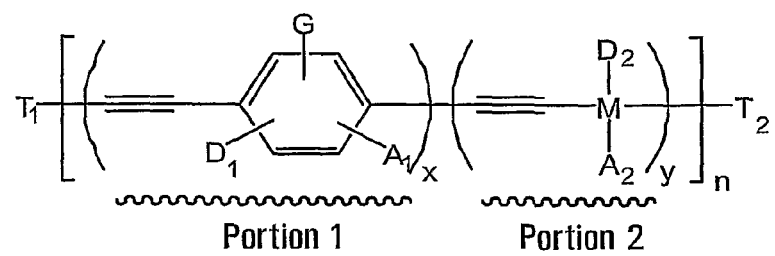
FIG. 2 is a schematic diagram of a generalized polymeric chain structure, exemplary of an embodiment of the present invention.

In a further exemplary embodiment of the present invention, the copolymer may be represented by the formula shown in FIG. 2. In this copolymer, the backbone of the copolymer includes a first repeat unit denoted as Portion 1 and a second repeat unit denoted as Portion 2. Each of Portion 1 or Portion 2 may be a poly(phenylene ethynylene) or a derivative of poly(phenylene ethynylene) (collectively referred to as PPE). For example, Portion 1 may be a phenylene ethynylene group, and Portion 2 may be a derivative of phenylene ethynylene. In different embodiments, Portions 1 and 2 may independently and randomly appear in the backbone chain thus forming a random copolymer, may alternatively appear thus forming an alternative copolymer, or may periodically appear thus forming a periodic copolymer. A Portion 1 and a Portion 2 may be directly linked by a covalent bond or may be indirectly linked through an intermediate group, and may form block copolymers. In FIG. 2, "x" or "y" denotes the average ratio of the number of Portion 1 or Portion 2 to the total number of PPE units in the copolymer. Thus, each of x and y may vary between 0 and 1 and x+y=1. In FIG. 2, "n" is an integer greater than 5, and may be greater than 10 in some embodiments. In some embodiments, n may be from 8 to 10.

Portion 1 contains at least one side chain "G" group and may optionally contains one or more side chain "$D_1$" or "$A_1$" groups. A "G" group is a group that can improve the solubility of the copolymer in an organic solvent. The G group in each individual Portion 1 unit may be independently selected. A "$D_1$" group is an electron-donor group and an "$A_1$" group is an electron-acceptor group. One side chain in Portion 1 may be both a G group and a $D_1$ group. The $A_1$ group may be omitted in Portion 1 in some embodiments.

The "M" group in Portion 2 may be a derivative of an aromatic or heterocyclic group. A "$D_2$" group is an electron-donor group and an "$A_2$" group is an electron-acceptor group. Portion 2 contains at least one substituent that is a $D_2$ or $A_2$ group, and may contain two or more substituents, where the substituents may include both $D_2$ and $A_2$ groups. When Portion 1 does not contain any $A_1$ group, Portion 2 should have at least one $A_2$ group.

The G, $D_1$ and $A_1$ groups present in Portion 1, $D_2$ and $A_2$ groups present in Portion 2, and the number of any particular group in each individual repeat unit, may be independently selected. For example, $D_1$ and $D_2$ may be different or the same. $A_1$ and $A_2$ may be different or the same. The number of electron donor groups and the number of electron acceptor groups in a repeat unit or in a polymer molecule may be the same or different.

"$T_1$" and "$T_2$" are terminal (end) groups of the backbone chain. $T_1$ and $T_2$ may be the same or different. $T_1$ and $T_2$ may be selected to provide a desired functionality in a particular application. However, it may not be necessary to control $T_1$ and $T_2$ in some embodiments.

Without being limited to any particular theory, it is expected that by including electron-donor and electron-acceptor groups as substituents attached to the backbone in the polymer, molecular orbital will become localized to some extent and the conjugation throughout the PE moiety is thus perturbed. Both electron-donor and electron-acceptor groups are also effective in reducing the energy gap between the highest occupied molecular orbital (HOMO) and the lowest unoccupied molecular orbital (LUMO) in the PPE. The changes in molecular orbital energy gap can be considered as defects in the material which can trap charge carriers and thus stabilize the ON or OFF state. For example, reduced energy band gap might reduce turn-on voltage in a memory device. Further, intra-molecular electric charge transfer is expected to be much easier than inter-molecular charge transfer.

Consequently, when a bias electric field is applied to the copolymer, electrons may be transferred from the electron donors to the electron acceptors along the backbone, and oppositely charged carriers are separated along the backbone by the applied field. Even after the bias field is removed, it still takes some time for the separated charges to remix. When the opposite charges are separated, the electric conductivity through the copolymer material is different from the electric conductivity of the copolymer where the charges are mixed. Thus, the compound can exhibit multi-stable conductivity states, and it is possible to switch between the two conductivity states by applying a suitable bias field. These properties of the compound can be conveniently utilized in a memory element or switching device.

As now can be appreciated, the PPE polymer shown in FIG. 1, may be modified as described herein and can still retain one or more of the beneficial properties thereof, or a similar property. For example, a modified embodiment of the present invention may be a compound that has a polymeric chain, which has a repeat unit that is repeated more than five (5) times. The repeat unit includes two cyclic groups conjugated to one another, such as by a π-conjugation bond, and a plurality of side groups each bonded to one of the cyclic groups. At least one side group bonded to the first cyclic monomer is an electron donor. At least one side group bonded to the second cyclic monomer is an electron acceptor. At least one of the side groups is selected to improve the solubility of the compound so that the compound is soluble in an organic solvent. The organic solvent may be toluene, benzene, xylene, tetrahydrofuran, chloroform, or dichloromethane. The electron donor group attached to the first cyclic monomer may be selected to improve the solubility of the compound in the organic solvent. The positions of the side groups on the cyclic groups may vary. It is expected that a change in the position of the electron donor or acceptor group will not significantly affect the multi-stable properties of the polymers.

A compound described herein may be formed according to a procedure described herein, or by modifying and combining synthesis techniques known to those skilled in the art based on the disclosure provided herein.

For example, a PPE described herein may be synthesized by Heck polycondensation of monomers, such as described in Heck R. F., *Palladium Reagents in Organic Syntheses*, Academic Press, 1985. A PPE may also be synthesized in a phase transfer catalyst (PTC) reaction of the monomers, such as described in Push C. and Percec V., *J. Polym. Sol., Part A: Polym. Chem.*, 1990, vol. 28, pp. 1101-1126. The resulting PPEs so prepared are semiconductors with conjugation through the phenyl and triple bond moieties. They are thermally stable with linear sp hybrid orbitals of ethynylene, which allow the PPE chains to stack in a more compact structure. A wide variety of flexible pendant (G) groups may be included in the polymer to improve the solubility of the final material, thus facilitating solution processing.

For example, for forming a compound with a polymeric chain structure shown in FIG. 2, monomers for forming the side chain or substituent groups in Portions 1 and 2 may be independently selected.

For example, the monomer or group for forming the side chain "G" may be a $C_{1-20}$ ($C_{1-20}$ denotes one to twenty carbon atoms) linear- or branched-chain alkyl group, or alkoxy group. It is introduced to improve the solubility of PPEs in organic solvents. As used herein, a soluble group refers to a group soluble in an organic solvent. A lipophilic group may be selected as the G group. Suitable G group may be a hexyl group, octyl group, 2-ethylhexyl group, decyl group, or dodecyl group, or a corresponding alkoxy group.

In some cases, the length of the side chain G may be limited to ensure that the resulting compound is sufficiently soluble. For example, in some cases, depending on the nature of the selected monomer, a long side chain, such as when there are more than 13 carbon atoms in the chain ($C_{14}$ or longer), may interdigitate, which can lead to reduced solubility. Thus, in some embodiments, side chain G may include a $C_{1-13}$ linear- or branched-chain alkyl group, or alkoxy group. This may improve solubility as the resulting compound is less likely to aggregate in an organic solution.

Each of $D_1$ and $D_2$ may be an electron-donor group which can transfer electron to another molecular entity in PPE. It may be introduced to decrease the energy level of LUMO and help to stabilize the separated charges in conjugated systems. Specific examples include hydroxyl (—OH), amino (—NH$_2$), alkyl amino (—NHR or —NR$_2$), alkyl (—R), alkoxy (—OR), easter (—COOR), aryl, thionyl, carbazol groups and their derivatives, wherein R is a $C_{1\text{-}20}$ ($C_{1\text{-}20}$ denotes one to twenty carbon atoms) linear- or branched-alkyl groups.

Each of $A_1$ and $A_2$ may be an electron-acceptor group which can accept electron from another molecular entity in the PPE. It may be introduced to increase the energy level of HOMO and to stabilize the separated charges in conjugated systems. Specific examples include cyano, isocyano, nitro, sulfonyl, sulfinyl, halogenated alkyl, formyl, carboxyl, carbonyl, alkyloxycarbonyl, aryloxycarbonyl, 1-tetrazolyl, carbzmoyl, and sulfamoyl groups.

The monomer for forming the M group, or the ring in a cyclic monomer in the repeat unit, may be selected independent of the other groups in the polymer, and may be a derivative of an aromatic or heterocyclic group. M may be an all-carbon aromatic group, such as phenyl, naphthayl, anthracenyl, indyl, azulyl, pentalyl, heptalyl, biphenylenyl, indacenyl, acenaphthyl, fluorenyl, phenalenyl, phenanthrenyl, anthracenyl, triphenylenyl, pyrenyl, naphthacenyl, pentacenyl, or hexacenyl. M may be a heterocyclic group, such as pyridyl, bipyridyl, pyrazinyl, pyrazolyl, pyrrolyl, imidazolyl, thieyl, benzothienyl, naphthothienyl, thianthrenyl, furyl, pyranyl, isobenzofuranyl, chromenyl, xanthenyl, phenoxathiinyl, purimidinyl, pyridaziny, indolizinyl, isoindolyl, indolyl, purinyl, quinolizinyl, quinolyl, phthalazinyl, pteridinyl, cabazolyl, acridinyl, phenanthridinyl, pyrrolinyl, imidazolinyl, or indolinyl.

Once the monomers are selected, they may be reacted to form the desired polymers utilizing the reaction routes appropriate for the selected monomers. Exemplary reaction routes and procedures for preparing PPE-a, PPE-b, PPE-c, and PPE-d polymers are discussed in the Examples below, and illustrated in FIGS. 7 and 8. For forming other PPEs, the reaction routes and procedures may be modified as can be understood by those skilled in the art.

The number average molecular mass (Mn) and the degree of polymerization of the polymers may be determined using any suitable technique. For example, Mn may be estimated or determined using the gel permeation chromatograph (GPC) technique. The degree of polymerization may be estimated from the measured Mn based on the average molecular weight of the monomers (or repeat units) in the polymer, as can be understood by those skilled in the art.

The solubility of a material may be determined by measuring the quantity of the material dissolved in a unit volume of the particular solvent to form a saturated solution at room temperature. For use in solution based coating, the solubility of the polymer may need to be on the order of mg/ml or higher, depending on the properties of the solute, the solvent, the coating surface, and other factors.

In a given embodiment, the solubility of the polymer may be readily measured. If the solubility of the polymer is too low, the solubility may be increased by adding more G side groups to the polymer until the desired solubility is reached.

A compound described herein may be conveniently used in an electronic device, such as in a memory cell, a data storage device, or a switching device. The compound may be conveniently provided in the form of a film. In some embodiments, depending on the monomers selected and the environmental conditions, the polymer components may self-assemble to form a layer of the compound.

Some of the PPE polymer molecules in a film may in some cases align with one another in a preferred orientation.

While charger carriers may move along the backbone of each polymer molecule or between different molecules, transfer or movement of the charge carriers along the backbone of the molecule is expected to be more likely to occur.

Conveniently, the electronic device with an active material formed from a compound described herein can exhibit multistable conductivity states, which can be switched or detected electrically, and can be utilized for data storage or in switching devices. For example, the exemplary compound described herein may be used in memory elements, cross point memory arrays, three dimension (3D) stacked memory devices, or three terminal data storage devices. A memory may be dynamic random access memory (DRAM), non-volatile and rewritable flash memory, write-once read-many-times (WORM) memory, or the like. A memory device may utilize threshold switching, electrical hysteresis, or negative differential resistance (NDR).

In comparison to single molecular OPEs (in an oligomer the number of monomer units, or repeat units, is less than 5), the polymeric compound described herein contains, in the backbone, a higher number of repeat units that include conjugated PE moieties, resulting in a longer conjugated backbone. Without being limited to any particular theory, it is expected that the conjugated backbone can provide an open (conductive) channel for movement of charge carriers. Thus, the PPE copolymer described herein can exhibit a higher electrical conductivity after application of the same forward bias field (in the "ON" state), as compared to an OPE with electron-donor/acceptor. As a result, a higher ON/OFF current ratio may be achieved with a PPE copolymer described herein, as compared to an OPE. For example, with a PPE copolymer described herein, an ON/OFF ratio as high as on the order of $10^5$ may be achieved. A higher ON/OFF current ratio can lead to reduced rates of read error in memory devices.

It is further expected that with a longer conjugated backbone, the positive charge carriers and the negative charge carriers can be separated by a longer distance along the backbone. Consequently, when the applied field is removed, it will take a longer time for the separated charge carriers to remix, which results in a longer retention time. For example, the ON state in a PPE polymer described herein may be maintained over a period of 30 hours. It is expected based on experimental data that in at least some embodiments the ON state may be maintained up to more than ten years.

Therefore, a polymeric compound described herein may be conveniently used as an active material in a memory element or device to enhance the ON/OFF current ratio and the retention time.

In an exemplary process, a film may be formed from a compound described herein as follows. The compound is dissolved in an organic solvent to form a solution. The solution is applied to a surface to form a liquid layer of the solution. The surface may be the top surface of a suitable substrate. The solvent is next removed, such as by evaporation, from the liquid layer to form a solid layer which includes the compound. To form a homogeneous film material, the polymer in the compound should have a Mn greater than 2000 g/mol. For example, if the monomers or repeat units in the copolymer have an average molar weight of about 200 g/mol, the degree of polymerization should be greater than 10 (or n>10).

The thickness of a film formed from a solution based processing method can range from about 0.01 to about 200 micrometers. The film may be formed on a substrate such as a bottom electrode.

Films of the compound may be conveniently formed on a substrate by a coating technique such as spin-coating, spray-coating, dip-coating, roller-coating and ink-jet printing. These coating techniques typically require the preparation of a coating solution with an organic solvent. Conveniently, the compounds described herein are soluble in various organic solvents and suitable for use in such techniques. The compound according to exemplary embodiments described herein can thus facilitate solution based processing.

By comparison, a PPE without sufficient soluble side chains is insoluble in organic solvents, and is thus not convenient to use in the solution based coating techniques discussed above.

It should be noted, however, that when the soluble side chains of the PE monomers are formed of groups with more than 14 carbons, aggregation of the PPE molecules in the solution may occur in some cases due to interdigitation. In these cases, aggregation may be prevented or reduced by limiting the number of carbons in the soluble side chain on the PE monomer to be less than 14 carbons.

For improved solubility and to facilitate film formation, the degree of polymerization in the copolymer may be selected to be higher than 10, or such that the number average molecular mass (Mn) is greater than 2000 g/mol.

The molecular weight (mass) of the PPE can also affect the formation of the film. For example, it is expected that a film formed with a PPE with a molecular weight less than 2000 g/mol is less homogeneous as compared to a film formed with a heavier PPE.

In a specific example, an exemplary compound described herein, such as PPE-a, may be dissolved in a suitable organic solvent, such as toluene, benzene, xylene, tetrahydrofuran (THF), chloroform, or dichloromethane, to form a solution. The concentration of the compound in the solution may be selected depending upon the boiling temperature of the solvent and the molecular weight of the compound used. For example, the solution may contain from about 0.5 to about 10 wt % (weight percent) of the PPE copolymer. The solution is applied onto a surface of a suitable substrate using a suitable solution coating technique to form a solution coating. The coating technique may be one of those discussed above. The organic solvent in the solution coating is then allowed to evaporate. To facilitate complete removal of the solvent, the solution may be heated and the gas above the solution may be pumped to reduce the gas pressure.

Conveniently, a film formed from a compound described herein, such as PPE-a, can be homogeneous with substantial uniform thickness, and substantially free of holes, cracks or other defects.

A PPE film may also be prepared from the compound by adapting and modifying a suitable procedure known to those skilled in the art. Self-assembly monolayer (SAM) and Langmuir-Blodgett (LB) film formation techniques may be used to form films of PPE. However, in films formed by an SAM or LB technique, physical and molecular packing defects may occur, which can affect the reliability and performance of the electronic devices in which such films are used.

According to a further exemplary embodiment of the present invention, the compound described herein may be used to form an electric field programmable film. The film may be used to form a memory device according to the techniques disclosed in U.S. Pat. No. 7,557,372 to Yang et al., entitled "Memory devices based on electric field programmable films", issued Jul. 7, 2009, the entire contents of which are incorporated herein by reference. As the compound is soluble in an organic solvent, it may be conveniently used to form a film.

Figure 3:
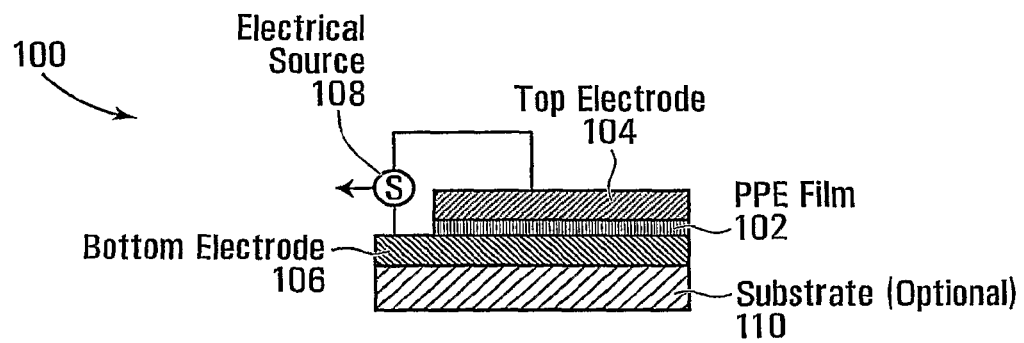
FIG. 3 is a schematic cross-sectional elevation view of an electronic structure, exemplary of an embodiment of the present invention.

FIG. 3 illustrates a memory cell 100, exemplary of an embodiment of the present invention. Memory cell 100 has a PPE film 102 sandwiched between a top electrode 104 and a bottom electrode 106. PPE film 102 is formed from the polymeric compound described herein, such as a compound having a chain structure shown in FIG. 1 or FIG. 2. Memory Cell 100 may be powered by an electrical power source 108. PPE film 102 and electrodes 104, 106 may optionally be supported on a substrate 110. In a different embodiment, substrate 110 may be absent. PPE film 102 may be prepared as described herein. Other components of memory cell 100 may be formed and constructed according to any suitable techniques of forming memory cells known to those skilled in the art.

Memory cell 100 may be switched between two different states by the application of an electric field. When memory cell 100 is in an "OFF" or "0" state, PPE film 102 has a relatively low electric conductivity. When memory cell 100 is in an "ON" or "1" state, PPE film 102 has a relatively high conductivity. Under a given applied voltage from power source 108, the ratio of electric current densities in PPE film 102 between "ON" and "OFF" state may be 5 or higher.

Power source 108 may be a direct current power supply, such as a battery.

One of top electrode 104 or bottom electrode 106 can be the cathode, and the other electrode can be the anode. The two electrodes can be of the same or different materials.

For example, an electrode such as top electrode 104 may be formed from a metal or alloy. Examples of suitable electrode materials include aluminum, gold, copper, barium, calcium, silver, magnesium, lithium, rubidium, strontium, or alloys containing two or more of gold, silver, platinum, copper, titanium, nickel, tungsten, indium, and tin. In some embodiments, aluminum, copper, gold, or a magnesium-silver alloy may be used.

Top electrode 104 may be provided in the form of a film, which may be fabricated by vacuum vapor deposition, sputtering, or lamination. The thickness of top electrode 104 may be from about 20 nm to about 10 µm, and may be selected depending on the desired electric conductivity and device durability, as can be understood by those skilled in the art.

An electrode such as bottom electrode 106 may be formed from a sheet of conductive material. The conductive material may be a metal, alloy, metal oxide, or polyelectrolyte. Suitable conductive materials include gold, copper, stainless steel, p- or n-type silicon wafer, indium oxide, tin oxide, zinc oxide, polyaniline, polypyrrole, polythiophene, or doped derivatives of a polyelectrolyte. For example, bottom electrode 106 may be formed of a thin film of mixed oxides of tin and indium (ITO). Bottom electrode 106 may be formed on a substrate, such as substrate 110.

Substrate 110 may be formed from any suitable material, such as glass, metal, plastic, or stainless steel.

A protective or encapsulation layer (not shown) may be provided to protect memory cell 100 from damage. A protective layer may be formed of a polymer, metal oxide, or metal fluoride. A cover layer may be formed of a glass plate, a plastic plate, or a stainless steel plate.

In use, a voltage applied across electrodes 104 and 106 may set the state of memory cell 100. Conversely, the state of memory cell 100 may be determined by measuring current through film 102 for an applied voltage. Conveniently, power source 108, may be used to apply a voltage to change the state of memory cell 100, or to test the state of memory cell 102.

Initially, memory cell 100 may be in the "OFF" (or "0") state. When memory cell 100 is in the OFF state, the conductivity of film 102, and hence the current density for an applied voltage is relatively low. As such, at a given applied voltage, the measured current through memory cell 100 is relatively low.

To set memory cell 100 to the "ON" (or "1") state, a voltage above a threshold voltage is applied across electrodes 104 and 106, using power source 108, thus creating the switching field in PPE film 102.

Once memory cell 100 is set to the ON state, the switching voltage may be removed. Memory cell 100 may remain in the ON state after removal of the switching field for a long period of time, such as more than 30 hours. In some embodiments, the ON state is expected to last for more than ten years. In some embodiments, such as when the memory cell is used in a DRAM device, a switching voltage may be reapplied periodically to refresh the ON state. When memory cell 100 is in the ON state, the current density (conductivity) is relatively high, and at the given voltage, the current is relatively high.

To read the present state of memory cell 100, the current through PPE film 102 (read current) may be measured when a read voltage is applied across electrodes 104 and 106. The read voltage should be lower than the switching threshold voltage to prevent unintended switching of the memory state. A relatively high read current indicates that memory cell 100 is in the ON state. A relatively low read current indicates that memory cell 100 is in the OFF state.

Memory cell 100 may be used in a WORM memory device, in which case it is not necessary to re-set the state of memory cell 100.

A memory cell formed from an embodiment of the composition described herein may also be used in a re-writable memory device, such as flash or DRAM memory. In such a case, after the memory cell has been set to the ON state, a reverse switching voltage may be applied to the memory cell to re-set (re-write) the memory cell to the OFF state.

Figure 4:
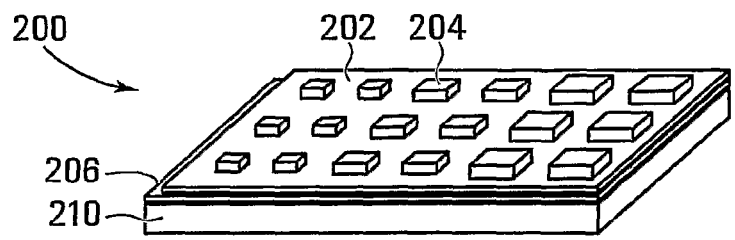
FIG. 4 is a schematic perspective view of an array of memory cells formed on a substrate, exemplary of an embodiment of the present invention.

FIG. 4 illustrates a two-dimensional array 200 of memory elements (cells), exemplary of an embodiment of the present invention. Array 200 is formed of a PPE layer 202, top electrode (pads) 204, a bottom electrode layer 206 which may be formed of ITO, and a substrate 210. PPE film 202 is formed from a polymeric compound described herein, such as one of the compounds having a polymeric chain shown in FIG. 1 or FIG. 2, and may be prepared according to a process described herein. The individual memory cells are defined by the size of the respective top electrode pad 204. Other components of array 200 may be formed and constructed according to any suitable techniques of forming memory cells known to those skilled in the art.

In a further embodiment, an additional electrode (not shown) may be added to each cell to form a three-terminal memory cell. The additional electrode may be introduced to apply an intermediate voltage to non-selected cells to prevent the formation of parasitic paths. The voltage may be controlled using a transistor (not shown) as can be understood by those skilled in the art.

Figure 5A:
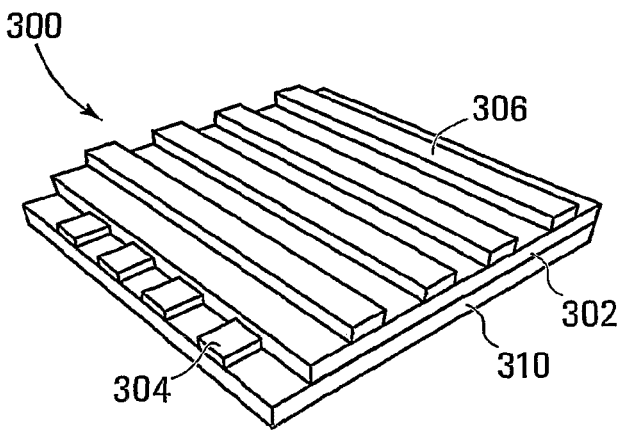
FIGS. 5A and 5B are schematic perspective views of addressable memory devices, exemplary of embodiments of the present invention.

FIG. 5A illustrates an x-y addressable two-dimensional array 300 of memory elements, exemplary of an embodiment of the present invention. Array 300 is formed of a PPE layer 302, word lines 304, bit lines 306, and a substrate 310. Word lines 304 and bit lines 306 are perpendicular to one another. A memory cell is formed at each intersection between a word line 304 and a bit line 306. The memory cells are thus independently addressable by applying an electric signal to, or detecting an electric signal from, the respective word and bit lines. As depicted, Array 300 has 4 word lines and 4 bit lines but in an actual memory array, there may be any suitable number of word lines and bit lines. PPE film 302 may be formed similar to film 202.

Figure 5B:
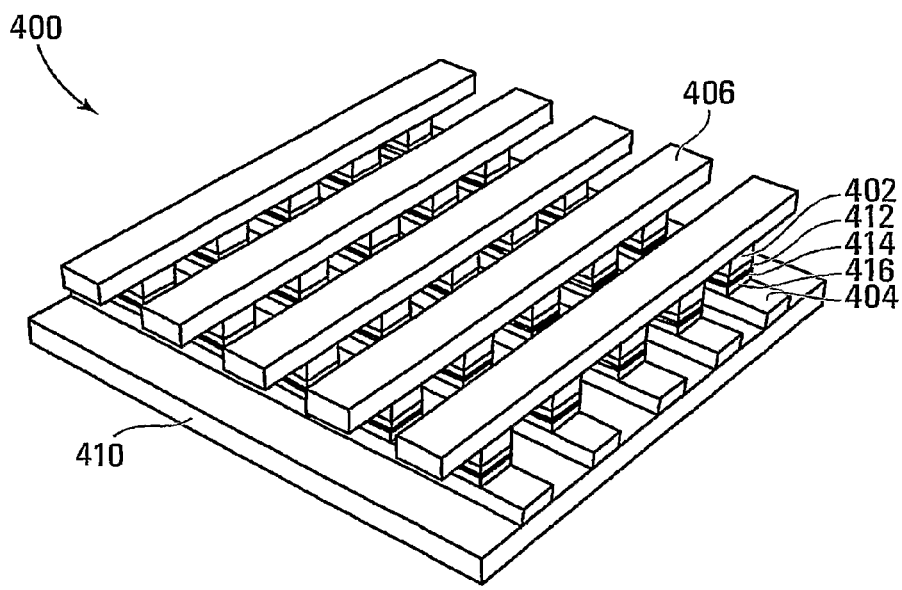

A potential problem that may arise in the use of array 200 or 300 is that parasitic current leakage may occur, due to possible formation of parasitic electrical paths in the PPE material, which may form in parallel to a selected node through its neighboring nodes. To prevent this potential problem, each PPE memory cell in the array may be connected in series to a diode. For example, FIG. 5B illustrates a modified array 400, exemplary of an embodiment of the present invention. As in array 300, array 400 includes a PPE layer 402, word lines 404, and bit lines 406, formed on a substrate 410. Array 400, however, also includes three additional layers 412, 414 and 416 sandwiched between PPE layer 402 and word lines 404. The top layer 412 is an n-doped silicon layer. Middle layer 414 is a thin intrinsic silicon layer. Bottom layer 416 is a p-doped silicon layer. Layers 412, 414 and 416 thus form PIN diodes sandwiched between PPE layer 402 and word lines 404, which can prevent parasitic paths in array 400. Word lines 404 in this case may be formed of Pt, Ti, or another electrode material.

In alternative embodiments, bottom layer 416 may be omitted and word lines 404 may be formed of a p-doped Si material.

In a different embodiment, a diode such as a p-Si layer (not shown) may be inserted between PPE layer 402 and each bit line 406 to prevent parasitic paths.

In further alternative embodiments, a buffer layer (not shown) may be provided between PPE layer 402 and word lines 404, which may be formed of Au, Cu, or another electrode material described herein. The buffer layer may be included to adjust the work function at the contact region between the word lines 404 and PPE layer 402.

Figure 6:
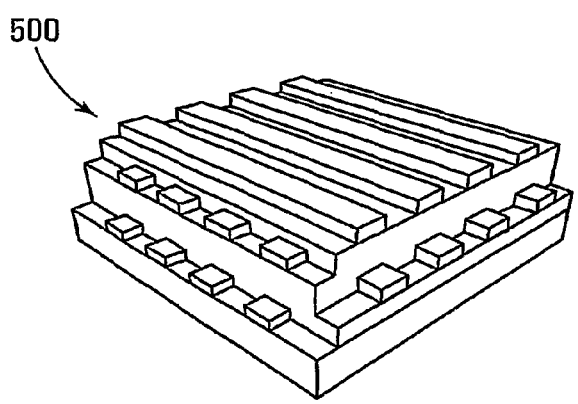
FIG. 6 is a schematic perspective view of a stacked addressable memory device, exemplary of an embodiment of the present invention.

FIG. 6 illustrates a three dimensional (3D) stacked data storage device 500, which may be considered to be formed of two stacked arrays 300.

The devices shown in FIGS. 3, 4, 5A, 5B, and 6 may be fabricated according to techniques commonly used in the semiconductor industry, with appropriate modifications based on the disclosure herein.

The devices shown in FIGS. 3, 4, 5A, 5B, and 6 can be operated according to any suitable operating procedures for similar conventional electronic memory devices known to those skilled in the art.

It is expected that, as compared to OPEs, an embodiment described herein can provide improved scalability, higher mechanical strength, higher ON/OFF current ratio, or longer retention time, or improved flexibility and ease for processing and device fabrication. Substantially homogeneous films may be formed from a compound described herein, such as the PPE-a polymer.

Exemplary embodiments of the present invention are further illustrated with the following examples, which are not intended to be limiting.

EXAMPLES

All starting materials mentioned in these examples were purchased from Aldrich Co. and used as received, unless otherwise specified. All solvents were dehydrated with standard methods and distilled under an inert atmosphere before use.

$^1$H NMR (nuclear magnetic resonance) spectra were measured in deuterated chloroform ($CDCl_3$) on a Bruker ACF 300 spectrometer at ambient temperature, with Tetramethylsilane (TMS) as the internal standard. Fourier transform infrared (FT-IR) spectra were measured using a Shimadzu FT-IR-8400 spectrophotometer with the sample dispersed in KBr pellets. Elemental analyses were carried out on a Perkin Elmer Series II CHNS/O analyzer 2400. Ultraviolet-visible (UV-vis) and fluorescence spectra were measured with a Shimadzu UV-3101 PC spectrophotometer and a Shimadzu RF-5301 PC luminescence spectrophotometer, respectively. Thermogravimetric analyses were carried out on a TA Instrument TGA 2050 thermogravimetric analyzer at a heating rate of 20° C. min$^{-1}$ and under a $N_2$ flow rate of 100 mL min$^{-1}$. Differential scanning calorimetry (DSC) measurements were carried out on a Mettler Toledo DSC 822e system under $N_2$ and at a heating rate of 10° C. min$^{-1}$.

Example I

Preparation of Sample Monomers

Figure 7:
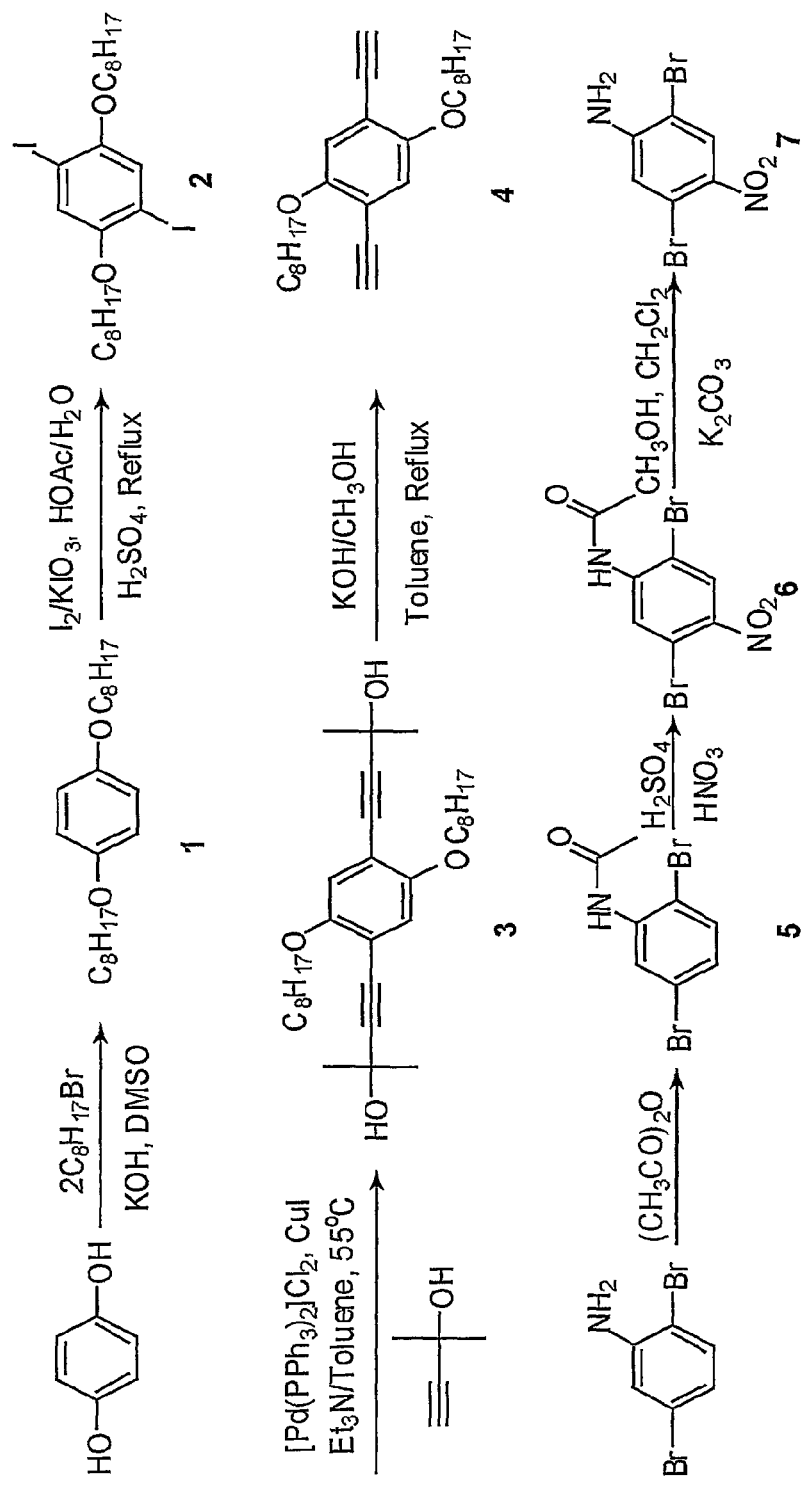
FIG. 7 is a schematic diagram illustrating synthesis routes for preparation of sample monomers.
Figure 8A:
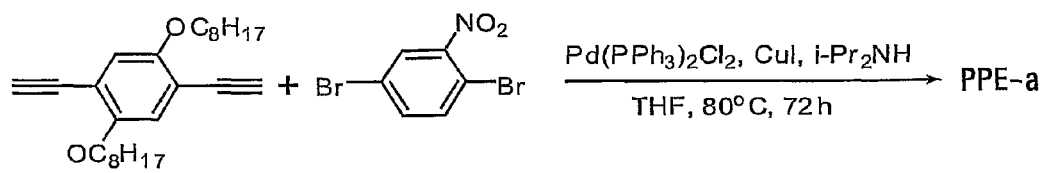
FIGS. 8A, 8B, 8C, and 8D are schematic diagrams illustrating exemplary synthesis routes for preparation of polymers with chain structures shown in FIG. 1.
Figure 8B:
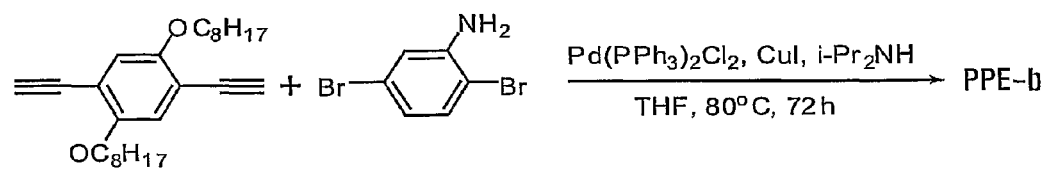
Figure 8C:
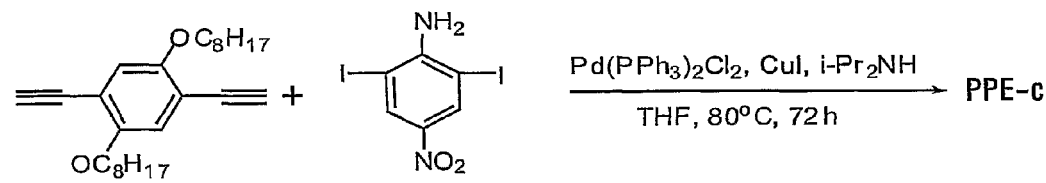
Figure 8D:
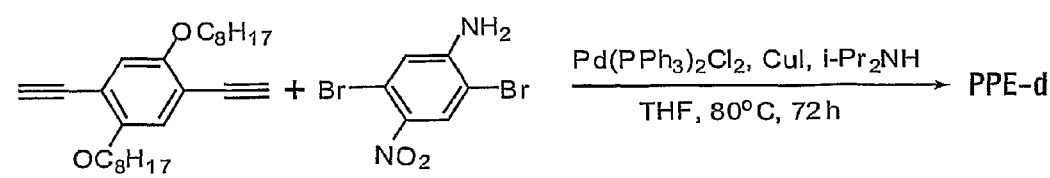

Sample monomers were prepared according to the synthesis routes shown in FIG. 7.

Example IA

Sample 1,4-bis(octyloxy)benzene (product 1 in FIG. 7) was prepared as follows.

About 44.9 g (0.8 mol) KOH and 200 mL dry dimethyl sulfoxide (DMSO) were added into a 500 mL dry flask. The mixture was stirred with nitrogen bubbling for 45 min. Crystals of p-biphenol (11 g, 0.1 mol) were added to the mixture and the mixture solution was stirred for 20 min. Next, n-bromooctane (50 mL, 0.29 mol) was added dropwise into the mixture over a period of 60 min at room temperature. The solution was stirred for an additional 6 hours. The resulting mixture was poured into 1000 mL of ice water under vigorous stirring. The precipitate in the solution was collected by filtration and recrystallization in 250 mL of a 1:1 mixture of acetone and methanol to obtain 30.8 g of purified product 1. Yield: 92%. m.p.: 57~58° C., $^1$H NMR (300 MHz, CDCl$_3$): δ (ppm)=0.85 (t, 6H, —CH$_3$), 1.25 (m, 16H, —CH$_2$—), 1.4~1.8 (m, 8H, —CH$_2$—), 3.90 (t, 4H, OCH$_2$), 6.82 (s, 4H, Ph H). Anal. Calcd for $C_{22}H_{38}O_2$: C, 78.99; H, 11.45. Found: C, 78.94; H, 11.49.

Example IB

Sample 1,4-diiodo-2,5-bis(octyloxy)benzene (product 2 in FIG. 7) was prepared as follows.

KIO$_3$ (5.63 g, 26.33 mmol) and I$_2$ (18.43 g, 75 mmol) were added to a solution, which contained 22 g of product 1 (0.096 mol) dissolved in 500 mL of acetic acid and 77 mL of 1.7 M H$_2$SO$_4$. The mixture was stirred at the reflux temperature for 9 h. After cooling to room temperature, a 10% solution of Na$_2$S$_2$O$_3$ was added to remove the residual I$_2$. The solution was poured into 1500 mL of water, and stirred for 20 min. The precipitate was collected by filtration and recrystallized from ethanol to obtain 42.1 g of purified product 2 as white crystals. Yield: 75%. m.p.: 52~53° C. $^1$H NMR (300 MHz, CDCl$_3$): δ (ppm)=0.84 (t, 6H, —CH$_3$), 1.25 (m, 20H, —CH$_2$—), 1.4~1.8 (m, 4H, —CH$_2$—), 3.90 (t, 4H, OCH$_2$), 7.18 (s, 2H, Ph H). Anal. Calcd for $C_{22}H_{36}I_2O_2$: C, 45.07; H, 6.19. Found: C, 45.03; H, 6.16.

Example IC

Sample 4,4'-(2,5-bis(octyloxy)-1,4-phenylene)bis(2-methylbut-3-yn-2-ol) (product 3 in FIG. 7) was prepared as follows.

Product 2 (10.5 g, 18 mmol), bis(triphenylphosphine)palladium (II) dichloride (0.176 g, 0.25 mmol) and 100 mL of toluene were introduced into an oven-dried round bottom flask equipped with a rubber septum and a magnetic stirring bar. The flask was then evacuated and backfilled with argon three times. A degassed solution of copper(I) iodide (0.088 g, 0.54 mmol) and 2-methyl-3-butyn-2-ol (3.03 g, 36 mmol) in 70 mL of triethylamine was added into the flask under an argon atmosphere. The final mixture was heated at 55° C. for 5 h. After being cooled to room temperature, the mixture was filtered to eliminate the ammonium salt and the solvent was removed under a reduced pressure. The solid residue was re-dissolved in toluene and purified by passing through a short SiO$_2$ column, followed by recrystallization in toluene to obtain 8 g of purified product 3. Yield: 89.2%. m.p.: 111~112° C. $^1$H NMR (300 MHz, CDCl$_3$): δ (ppm)=0.84 (t, 6H, —CH$_3$), 1.25 (m, 20H, —CH$_2$—), 1.4~1.8 (m, 4H, —CH$_2$—), 1.60 (s, 12H, —CH$_3$), 2.20 (s, 2H, —OH), 3.90 (t, 4H, OCH$_2$), 6.83 (s, 2H, Ph H). Anal. Calcd for $C_{32}H_{50}O_4$: C, 77.06; H, 10.10. Found: C, 76.95; H, 9.98.

Example ID

Sample 1,4-diethynyl-2,5-bis(octyloxy)benzene (product 4 in FIG. 7) was prepared as follows.

Product 3 (8.17 g, 16.4 mmol) and 150 mL of toluene were introduced into a 250 mL round bottom flask equipped with a condenser and a funnel. A solution of 2.2 g KOH (40 mmol) in 40 mL of methanol was added after the mixture was heated to 80° C. After being heated at reflux temperature for 30 min, the solution was distilled till the boiling point reach 110° C. to eliminate the low boiling components. The solution was heated at 110° C. for another 4 h. The mixture was cooled to room temperature and poured into 200 mL of saturated aqueous solution of NH$_4$Cl. The organic layer was washed with water three times and dried over anhydrous MgSO$_4$. The crude product was obtained after removal of the solvent under reduced pressure. It was purified by recrystallization in n-hexane to produce 3.5 g of purified product 4. Yield: 55.7%. m.p.: 66~67° C. $^1$H NMR (300 MHz, CDCl$_3$): δ (ppm)=0.84 (t, 6H, —CH$_3$), 1.25 (m, 20H, —CH$_2$—), 1.4~1.8 (m, 4H, —CH$_2$—), 3.36 (s, 2H, —CH), 3.92 (t, 4H, OCH$_2$), 6.83 (s, 2H, Ph H). Anal. Calcd for $C_{26}H_{38}O_2$: C, 81.62; H, 10.01. Found: C, 81.49; H, 9.96.

Example IE

Sample 2,5-dibromoacetanilide (product 5 in FIG. 7) was prepared as follows.

2,5-Dibromoaniline (10 g, 40 mmol, 97%, Acros), 40 mL of acetic anhydride and 40 mL of water were introduced into a flask. The mixture was maintained at reflux temperature for 4 h and then poured into 500 mL of water. The precipitate was collected by filtration, washed with water, and recrystallized from ethanol to obtain 6.86 g of purified product 5. Yield: 58.5%. m.p.: 172.5~173.5° C. $^1$H NMR (300 MHz, CDCl$_3$): δ (ppm)=2.21 (s, 3H, —COCH$_3$), 6.70~8.33 (m, 4H, Ph H). Anal. Calcd for $C_8H_7Br_2NO$: C, 32.80; H, 2.41; N, 4.78. Found: C, 32.73; H, 2.38; N, 4.76.

Example IF

Sample 2,5-dibromo-4-nitroacetanilide (product 6 in FIG. 7) was prepared as follows.

Product 5 (1.68 g, 5.73 mmol) was introduced into a cooled mixture of 5.6 mL 70% HNO$_3$ and 7.5 mL 98% H$_2$SO$_4$. The mixture was stirred for 2 h at 0° C. and 2 h at room temperature. Then 50 g of crushed ice was added. The precipitate was collected by filtration and purified by recrystallized from methanol to obtain 1.78 g of purified product 6. Yield: 98%. m.p.: 158~159° C. $^1$H NMR (300 MHz, CDCl$_3$): δ (ppm)= 2.32 (s, 3H, —CH$_3$), 8.15~9.00 (m, 2H, Ph H). Anal. Calcd for C$_8$H$_6$Br$_2$N$_2$O$_3$: C, 28.43; H, 1.79; N, 8.29. Found: C, 28.25; H, 1.67; N, 8.48.

Example IG

Sample 2,5-dibromo-4-nitroaniline (product 7 in FIG. 7) was prepared as follows.

K$_2$CO$_3$ (2.76 g, 20 mmol) was introduced into a solution of product 6 (1.69 g, 5 mmol) in 30 mL of CH$_2$Cl$_2$ and 30 mL of CH$_3$OH. The mixture was stirred at room temperature for 3 h. About 50 mL of water was added. The mixture was extracted with CH$_2$Cl$_2$ and dried over anhydrous MgSO$_4$. The crude product was obtained after solvent removal under reduced pressure. It was purified by recrystallization from ethylacetate to give 1.32 g of purified product 7. Yield: 89.2%. m.p.: 160-161° C. $^1$H NMR (300 MHz, CDCl$_3$): δ (ppm)= 7.20~8.22 (m, 2H, Ph H). Anal. Calcd for C$_6$H$_4$Br$_2$N$_2$O$_2$: C, 24.35; H, 1.36; N, 9.47. Found: C, 24.83; H, 1.45; N, 9.33.

Example II

Preparation of Sample PPE Polymers

Samples of PPE-a, PPE-b, PPE-c, and PPE-d copolymers were prepared according to the synthesis routes shown in FIGS. 8A, 8B, 8C, and 8D, respectively.

For preparing PPE-a, monomer of product 4 (1.16 g, 3.03 mmol), 1,4-dibromo-2-nitrobenzene (0.84 g, 3 mmol, 99%, Aldrich), bis(triphenylphosphine)palladium (II) dichloride (21 mg, 0.03 mmol, 99.99%, Aldrich) and 8 mL THF were introduced into an oven-dried round bottom flask equipped with a rubber septum and a magnetic stirring bar. The flask was then evacuated and backfilled with argon three times. A degassed solution of copper (I) iodide (12.3 mg, 0.075 mmol, 99.999%, Aldrich) in 4 mL diisopropylamine was added into the flask under an argon atmosphere. The reactor was sealed and kept at 80° C. for 72 h. After being cooled to room temperature, the mixture was filtered to eliminate ammonium salt. The solvent was removed by pumping under reduced pressure to obtain solid polymer PPE-a. The crude PPE-a was purified by dissolution in 10 mL of THF and precipitation in 200 mL of methanol three times each, followed by drying under reduced pressure.

The synthesis procedures of PPE-b, PPE-c and PPE-d were similar to that of PPE-a, except 1,4-dibromo-2-nitrobenzene was substituted by 2,5-dibromoaniline (97%, Acros), 2,6-diiodo-4-nitroaniline (98%, Aldrich) and 2,5-dibromo-4-nitroaniline (product 7), respectively. Sample of PPE-b was prepared as a comparison sample.

The respective yields are listed in Table I.

TABLE I

| Polymer | Yield (%) | M$_n$ (g/mol) | M$_w$/M$_n$ | T$_g$ (° C.) | T$_d$ (° C.) |
|---|---|---|---|---|---|
| PPE-a | 82 | 4200 | 1.77 | 84.5 | 340 |
| PPE-b (comparison) | 75 | 5300 | 2.40 | 81.4 | 386 |
| PPE-c | 79 | 4700 | 1.68 | 73.9 | 338 |
| PPE-d | 76 | 4300 | 2.10 | 80.8 | 336 |

Samples polymers of PPE-a, PPE-b and PPE-c were in the form of dark orange powders, while PPE-d was a dark brown powder.

Example III

Measurements of Properties of Sample PPEs

The number average molecular weights (M$_n$) and polydispersity index (M$_w$/M$_n$) of the sample polymers were determined with reference to polystyrene standards, using a Waters 1515 gel permeation chromatograph (GPC). The GPC was equipped with a refractive index detector, and HR 1, HR 2, and HR 4 columns to allow separation of polymers with molecular weights in the range of 10$^2$~5×10$^5$ g/mol. The columns were calibrated with polystyrene standards. Tetrahydrofuran was used as an eluent at a flow rate of 1.0 mL/min and 30° C.

Mn of the sample PPE polymers were found to range from 4200 to 5300 g/mol, corresponding to a degree of polymerization of about 8 to about 10 (n=8~10 in FIG. 1).

All sample polymers were found soluble in tetrahydrofuran (THF), toluene and dimethyl acetamide (DMAc), consistent with the presence of long alkoxy side chains in the starting monomer (product 4).

All sample polymers prepared were found soluble in THF, toluene and dimethyl acetamide.

Figure 9:
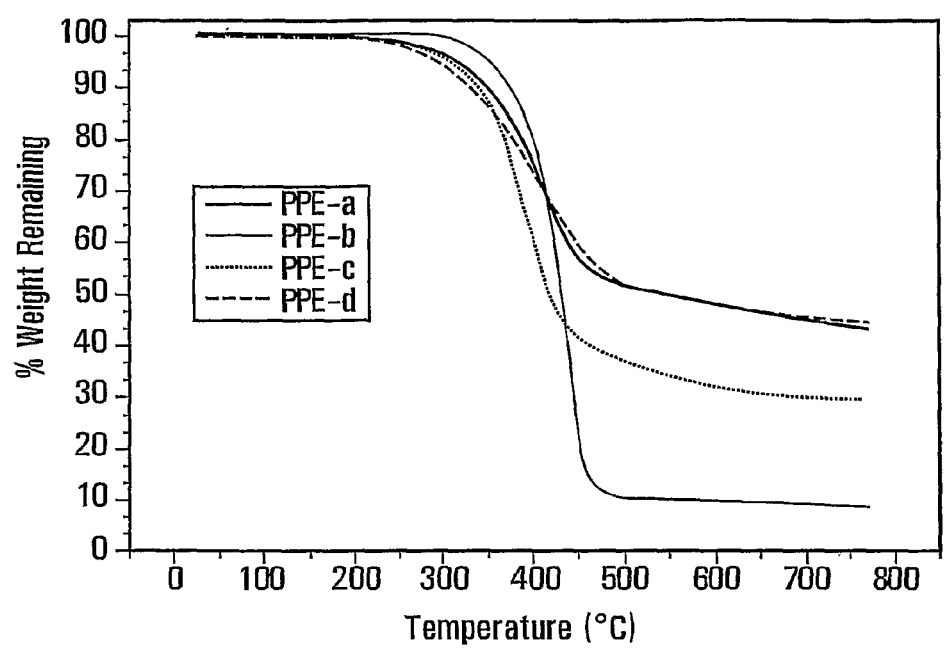
FIG. 9 is a line graph showing measured thermal gravimetric analysis (TGA) data, obtained from sample materials.

The thermal properties of the sample PPE polymers were investigated by Differential scanning calorimetry (DSC) and thermogravimetric analysis (TGA) measurements. Thermal stability was evaluated with a TA 2000 thermogravimetric analyzer at a heating rate of 20° C./min in nitrogen. The glass-transition temperatures (T$_g$) of the sample PPE polymers were measured by DSC under a nitrogen flow at a heating rate of 10° C./min, and were found to range from 73.9 to 84.5° C. The measured T$_g$ values of the sample PPE polymers were consistent with the T$_g$'s of typical PPE polymers. The TGA results suggested that all sample PPE polymers had good thermal stability. Their onset decomposition temperatures (T$_d$) in nitrogen range from 336 to 386° C. FIG. 9 shows representative TGA curves of the sample polymers. The polymers showed a sharp weight loss at temperatures above 400° C., indicating decomposition of the polymer backbones at such temperatures. Different substituent groups are expected to give rise to different amount of char residues at temperatures above 450° C. The heat resistance properties suggested that the sample PPEs were thermally stable at temperatures for most electronic processing operations. The sample PPE polymers exhibited thermal stability that was suitable for use in electronic storage or switching devices.

Some representative measured data are also listed in Table I.

FT-IR spectra, elemental analysis, $^1$H NMR spectra, UV-vis and fluorescence spectra of sample PPE polymers and monomer of product 4 were obtained. The spectra of sample PPE polymers showed existence of irreversible n-doping and p-doping processes.

Figure 10:
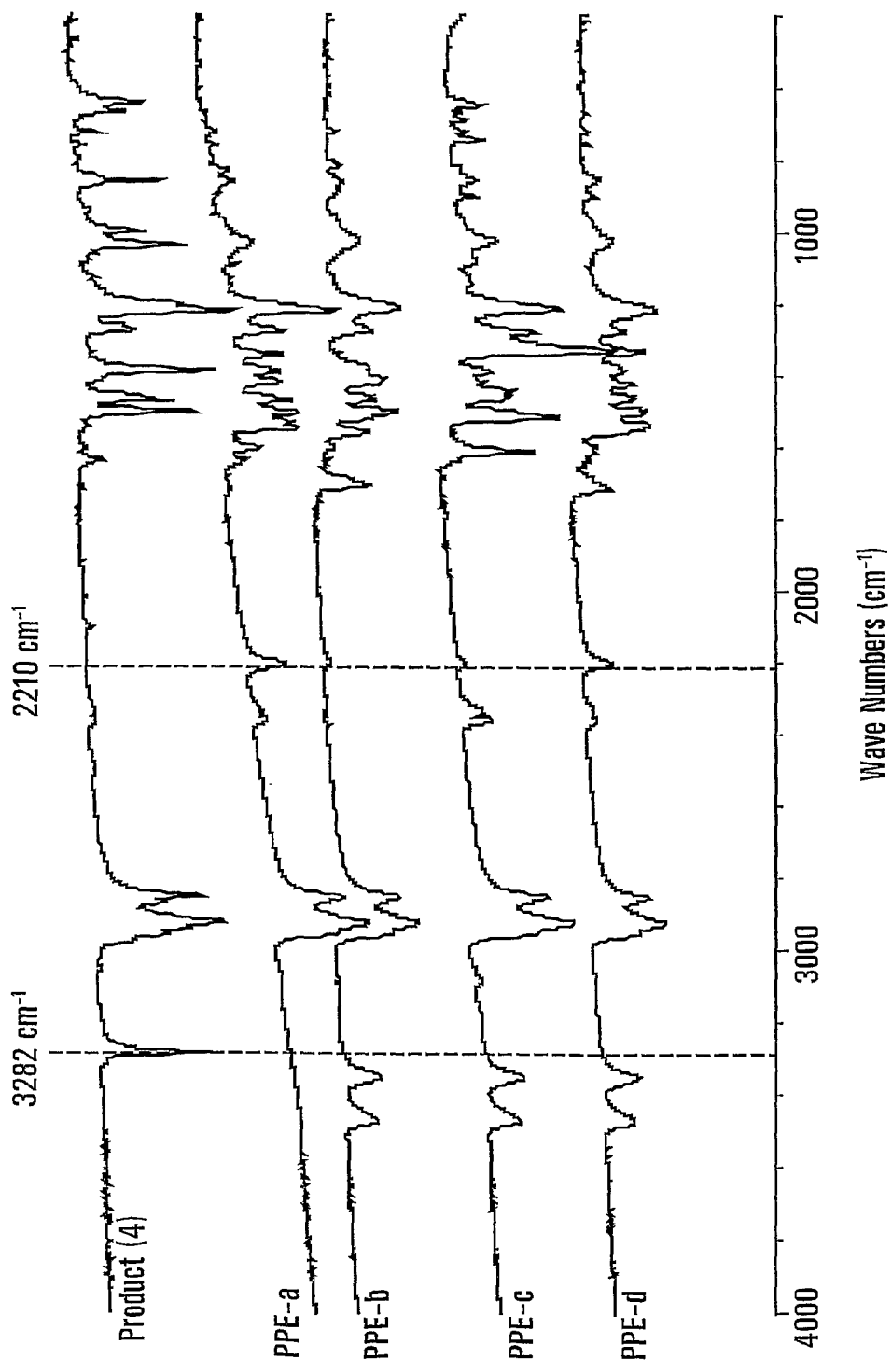
FIG. 10 is a line graph showing Fourier transform infrared (FT-IR) spectra of sample materials.
Figure 11:
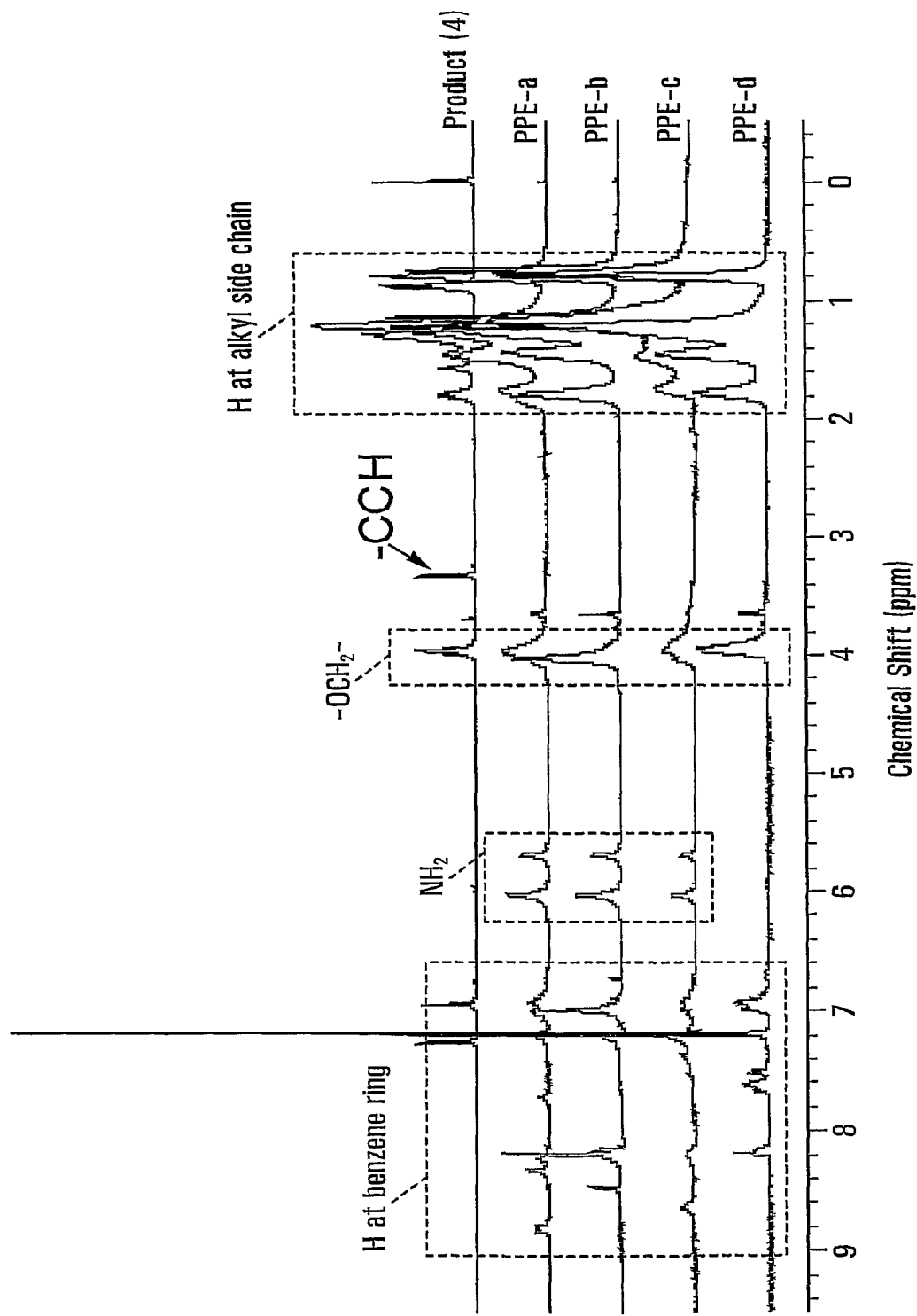
FIG. 11 is a line graph showing $^1$H NMR (nuclear magnetic resonance) spectra of sample materials.
Figure 12:
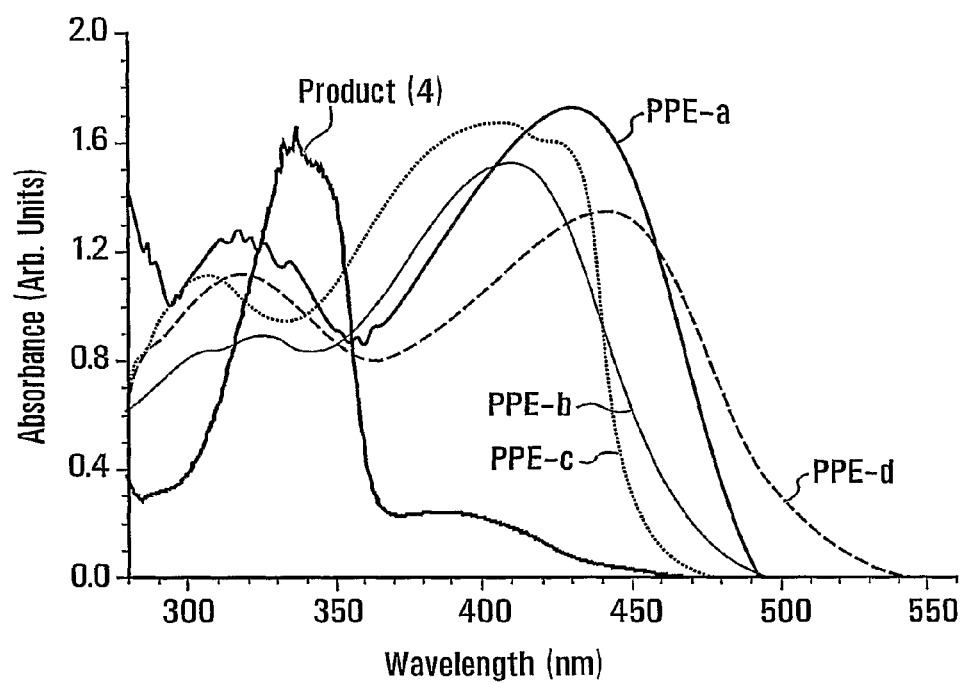
FIG. 12 is a line graph showing Ultraviolet-visible (UV-vis) spectra of sample materials.

Representative FT-IR spectra, $^1$H NMR spectra, and UV-vis spectra are shown in FIGS. 10, 11 and 12, respectively. As can be seen, the strong terminal ν(C≡C—H) vibration peak at about 3282 cm$^{-1}$ exhibited by monomer of product 4 disappeared after polymerization. Instead, the sample PPEs showed a ν(C≡C) peak at about 2210 cm$^{-1}$, characteristic of disubstituted acetylene. The $^1$H NMR spectra of the monomer and polymers (FIG. 11) also indicate that the terminal acetylene proton peak of product 4 disappeared after polymerization. The $^1$H NMR spectra also revealed chemical shifts which were consistent with the expected chemical structures of the sample PPEs.

FIG. 12 shows representative UV-vis absorption spectra obtained from the sample PPEs and product 4 in $1.2 \times 10^{-6}$ M THF solutions. The UV-vis absorption maxima of the sample polymers were red-shifted by at least 100 nm from that of product 4, consistent with the increase in effective π-conjugation length. The UV-vis absorption maxima of the polymer films also occurred at a considerably longer wavelength than those of the corresponding THF solutions, suggesting the presence of strong intermolecular interactions in the solid state. The wavelengths of UV-vis absorption maxima of the sample PPEs in THF and in the solid state (thin film form) are also listed in Table II.

TABLE II

| Polymer | $E_{red(onset)}$ (V) | $E_{ox(onset)}$ (V) | HOMO (eV) | LUMO (eV) | $E_{g(ele)}$ (eV) | $\lambda_{max}$ (nm) in THF | $\lambda_{max}$ (nm) in Film | $E_{g(opt)}$ (eV) |
|---|---|---|---|---|---|---|---|---|
| PPE-a | −0.80 | 1.32 | −5.67 | −3.55 | 2.12 | 429 | 454 | 2.52 |
| PPE-b | −0.96 | 1.12 | −5.47 | −3.40 | 2.08 | 410 | 425 | 2.31 |
| PPE-c | −0.87 | 1.30 | −5.65 | −3.47 | 2.17 | 408 | 448 | 2.60 |
| PPE-d | −0.87 | 1.17 | −5.53 | −3.52 | 2.05 | 442 | 456 | 2.30 |

Figure 13:
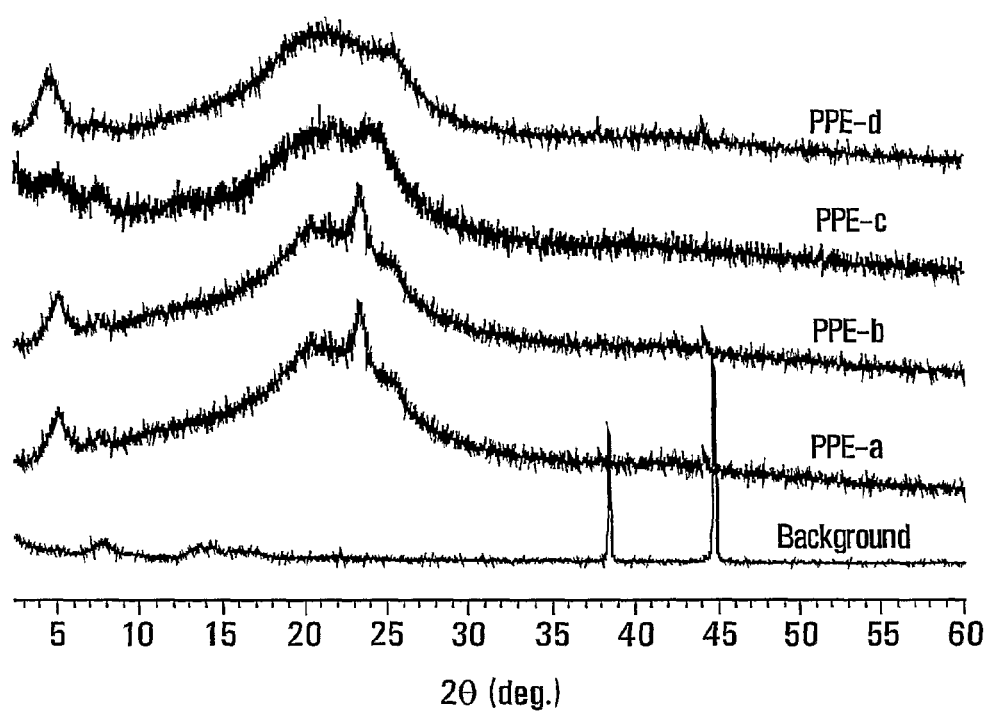
FIG. 13 is a ling graph showing X-ray diffraction (XRD) patterns of sample materials.

The powder X-ray diffraction (XRD) patterns of the sample PPEs were also measured using aluminum sample holder, with a scanning rate of 2 degree/min at room temperature. Representative results are shown in FIG. 13. The results suggested that the four sample PPEs contained polycrystalline domains. The diffraction peak appearing in the small-angle region (2θ<7°) in FIG. 13 may be assigned to the intermolecular distance between two main chains separated by the long side chains, similar to the cases of rigid π-conjugated polymers with long side chains. The sample PPE-a, PPE-b and PPE-d polymers showed a similar diffraction peak at 2θ=5°, due to the same 1,4-substituted structure, while the sample PPE-c polymer showed only a very weak peak at around 2θ=5°, due to unfavorable geometry for regular packing in the 1,3-substituted structure. All sample polymers showed the amorphous peaks at about 2θ=22°. PPE-a and PPE-b with mono-substituted —NO$_2$ acceptor (for PPEa) and —NH$_2$ donor (for PPE-b) exhibited an additional sharp diffraction peak at 2θ=24°. The polymers with di-substituted —NH$_2$ and —NO$_2$ moieties (PPE-c and PPE-d) showed only a broad peak in the region.

Example IV

Sample Films formed from Sample PPEs

Films of the PPE polymers were prepared from toluene or THF solutions of the sample PPE polymers (15 mg/mL) by spin-coating at a spin rate of 2000 rpm on a quartz glass plate at room temperature. The sample films were dried under reduced pressure at room temperature over night.

Homogeneous films were obtained from toluene solutions of PPE-a and PPE-b. Films of PPE-c and PPE-d, cast from either toluene or DMAc solutions, were also prepared, but were found to tend to contain aggregates.

Figure 14:
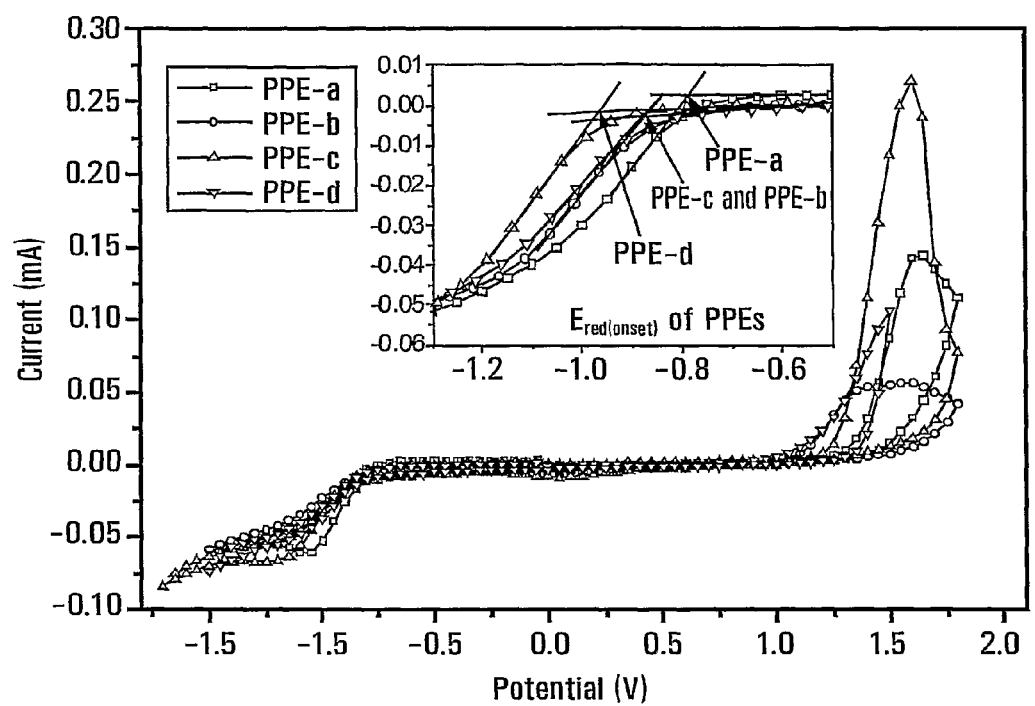
FIG. 14 is a line graph showing Cyclic voltammetry (CyV) data obtained from sample polymer materials.

Cyclic voltammetry (CyV) measurements of the sample polymers were made on an Autolab potentiostat/galvanostat electrochemical workstation at a scan rate of 50 mV s$^{-1}$, with a platinum wire counter electrode and an Ag/AgCl reference electrode in an anhydrous and nitrogen-saturated 0.1 mol L$^{-1}$ acetonitrile solution of tetrabutylammoniumhexafluorophosphate (n-Bu$_4$NPF$_6$). The polymers were coated on the platinum plate working electrodes from dilute toluene solutions. Representative results are shown in FIG. 14. The CyV results showed that the oxidative onset potentials (p-doping) for PPE-a, PPE-b, PPE-c and PPE-d polymers were 1.32, 1.12, 1.30 and 1.17 V vs. Ag/Ag$^+$, respectively, and the reductive onset potentials (n-doping) for PPE-a, PPE-b, PPE-c and PPE-d polymers were −0.80, −0.96, −0.87 and −0.87 V vs. Ag/Ag$^+$, respectively. The HOMO and LUMO of these PPEs were in the range of 5.47~5.67 and 3.40~3.56 eV, respectively. The band gap between HOMO and LUMO was found to be around 2.1 eV.

Some representative measured data and calculated data based on the measured data are shown in Table II. In Table I$_1$, $E_{red(onset)}$ is onset reduction potential measured by cyclic voltammetry; $E_{ox(onset)}$ is onset oxidation potential measured by cyclic voltammetry; highest occupied molecular orbital (HOMO) and lowest unoccupied molecular orbital (LUMO) were calculated from the electrochemical reduction potentials; $E_{g(ele)}$ is band gap calculated from the electrochemically determined LUMO and HOMO energy levels; $\lambda_{max}$ is UV-vis absorption maxima; and $E_{g(opt)}$ is optical band gap estimated from the UV-vis absorption band edges of the PPEs in the solid state.

On anodic sweeps, the onset oxidative potentials (p-doping) for PPE-a, PPE-b, PPE-c and PPE-d were at 1.32, 1.12, 1.30 and 1.17 V, respectively. The oxidative potential can be considered to be associated mainly with the donor units, and its magnitude was expected to reflect the electron-donating ability of the structure. PPE-b with the —NH$_2$ group (a strong electron donor) and alkoxy group (a weak electron donor) in the repeat units had an onset oxidative potential of 1.12 V. PPE-c and PPE-d also contained the —NO$_2$ acceptor group, which weakened the electron donating abilities of the polymers and gave rise to high oxidative potentials in these two polymers. PPE-a with the weak electron donor (alkoxy group) and the strong electron acceptor (—NO$_2$ group) had the highest oxidative potential of 1.32 V among the four types of sample polymers.

The onset reduction potentials (n-doping) for PPE-a, PPE-b, PPE-c and PPE-d were −0.80, −0.96, −0.87 and −0.87 V, respectively. The susceptibility to n-doping of a polymer reflected the affinity of the polymers for electrons. PPE-a showed the highest onset potential for n-doping at −0.80 V among the four PPEs due to the presence of the easily reducible —NO$_2$ group and a weak electron donor group (alkoxy group). PPE-b with the hard to reduce —NH$_2$ group and a weak electron donor (alkoxy group) showed the lowest onset potential for n-doping at −0.96 V among the four polymers. PPE-c and PPE-d had about the same onset potential for n-doping at −0.87 V, as they had the same donor-acceptor groups (—NO$_2$, —NH$_2$ and alkoxy groups). The position of substitution did not seem to have a strong effect on the reduction potential.

The HOMO and LUMO energy levels of the polymers were calculated from the onset oxidation potential ($E_{ox(onset)}$ and onset reduction potential ($E_{red(onset)}$), based on the reference energy level of ferrocene (4.8 eV below the vacuum level): HOMO=$E_{ox(onset)}$+4.8−$E_{Foc}$; LUMO=$E_{red(onset)}$+4.8−$E_{Foc}$, wherein $E_{Foc}$ is the potential of Foc(ferrocene)/Foc+ vs. Ag/AgCl. The value of $E_{Foc}$ was 0.447 V (measured for calibration). The HOMO energy levels ranged from 5.47 to 5.67 eV and the LUMO from 3.40 to 3.55 eV. The band gaps between the HOMO and LUMO for the four polymers were about 2.1-2.2 eV. The electrochemically determined band gaps, $E_{g(ele)}$, were somewhat smaller than the corresponding band gaps determined optically from UV-vis absorption band edges ($E_{g(opt)}$ around 2.3-2.6 eV, see Table II). It has been reported that the band gap of the alkyl substituted π-conjugated poly(phenylene ethynylene)s with 13 repeat units is about 3.0 eV. The introduction of electron donor and accepter groups had distinctively reduced the band gap. Thus, it is expected the sample PPEs could be activated more easily, or can be expected to give rise to more efficient charge transfer and transport of charge carriers.

Example V

Sample PPE based Electronic Device

Sample memory devices based on sample PPE polymers were fabricated as follows.

Indium-tin-oxide (ITO) coated glass substrates were pre-cleaned with water, acetone and isopropanol, in that order, in an ultrasonic bath for 15 min. A toluene solution (50 µL) containing 15 mg/mL of one of the PPEs was spin-coated at 2000 rpm onto an ITO substrate of a size of about 2.5 cm×2.5 cm, followed by solvent removal in a vacuum oven at $10^{-5}$ Torr and 60° C. for 12 h. The thickness of the PPE layer was about 50 nm. Aluminum top electrodes (for needle contacts) of 0.4×0.4, 0.2×0.2, 0.15×0.15 mm² in areas and 0.3 µm in thickness were thermally evaporated onto the polymer surface at about $10^{-7}$ Torr through a shadow mask.

The sample devices were characterized, under ambient conditions, using a Hewlett-Packard 4156A semiconductor parameter analyzer equipped with an Agilent 16440A SMU/pulse generator.

The sample single-layer ITO/PPE/Al sandwich structure used for studying bistable electrical switching effects is schematically illustrated in FIG. 4. PPE-c and PPE-d samples were not used for the electrical switching studies. Devices based on homogenous films of PPE-a and PPE-b showed reproducible results.

Figure 15:
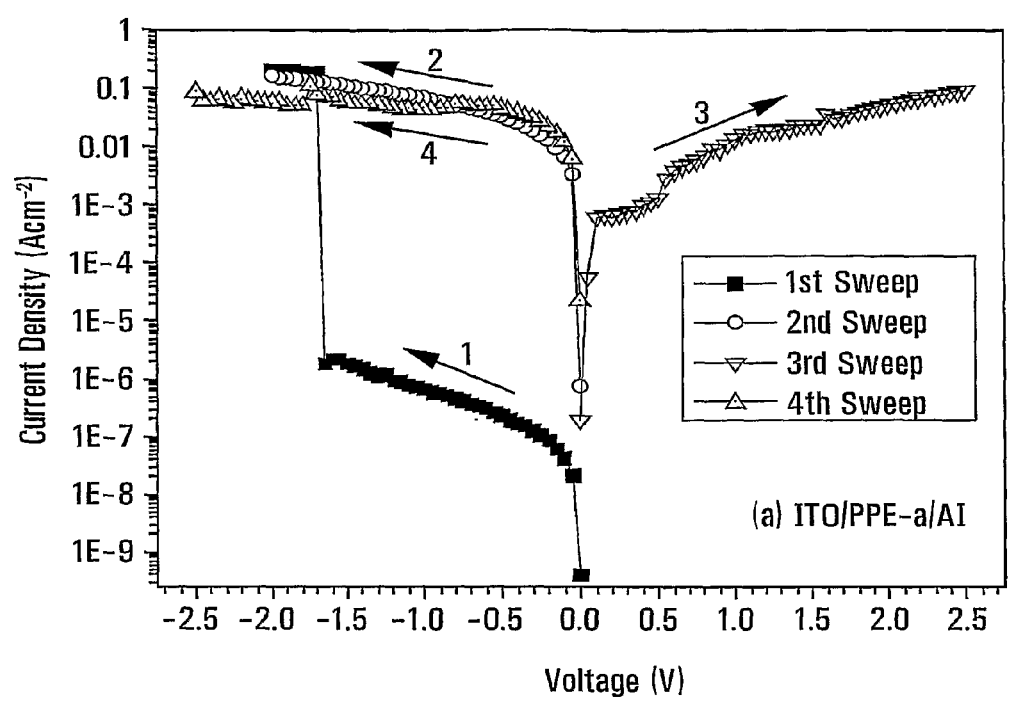
FIGS. 15 and 16 are data graphs showing the dependence of current density on bias voltage in sample polymer materials.
Figure 16:
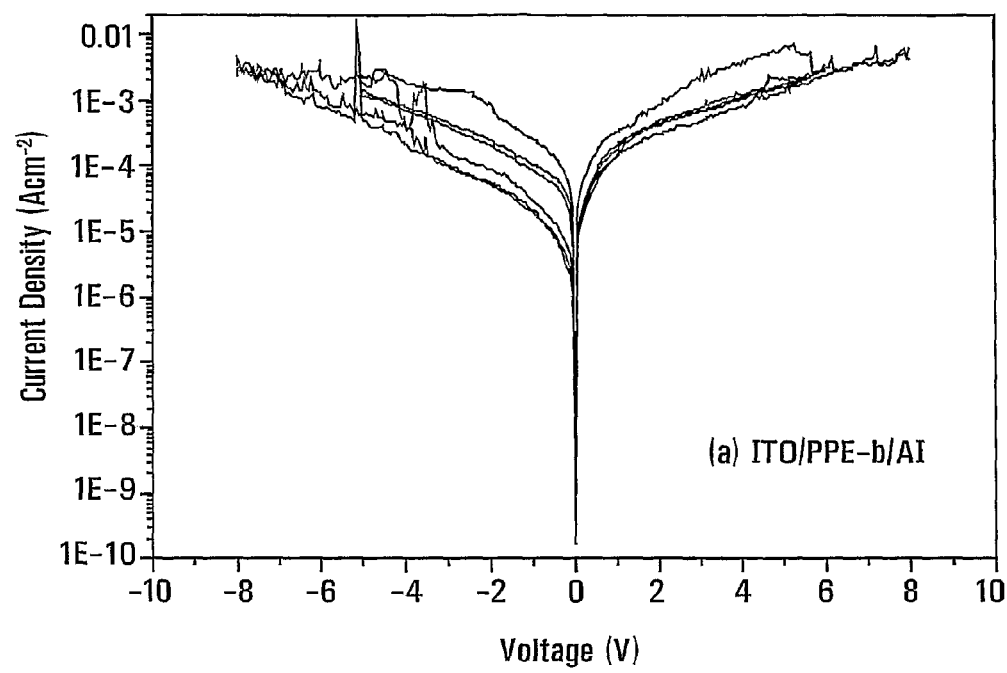

The sample devices were characterized by applying a voltage with ITO as the ground electrode. FIGS. 15 and 16 show typical current density-voltage (J-V) characteristics of the sample devices based on PPE-a and PPE-b respectively, with both negative and positive sweeps.

As PPE-b had only electron donor groups (—$NH_2$ and alkoxy groups), it was not expected to exhibit electrical bistability. The measured J-V characteristics of the sample device based on PPE-b did not exhibit any obvious transition during the positive and negative voltage sweeps between 0-8 V (see FIG. 16). PPE-b may however be used in light-emitting diode.

In contrast, in PPE-a polymer, both alkoxy donor and —$NO_2$ acceptor moieties are present. The sample device based on PPE-a exhibited two distinctive conductivity states (see FIG. 15), and was used for a detailed study of bistable electrical switching and memory effects. As shown in FIG. 15, during the 1st sweep, the current of the sample ITO/PPE-a/Al device increased slowly with the voltage and remained at a low level (about $10^{-7}$~$10^{-6}$ A/cm², OFF-state) in the voltage range of 0 to −1.65 V. At the switching threshold voltage of about −1.65V, an abrupt increase in J from $10^{-6}$ to $10^{-1}$ A/cm² occurred, indicating the device's transition from a low conductivity state (OFF-state) to a high conductivity state (ON-state). This electrical transition from the OFF-state to the ON-state may be utilized in a "writing" process for a memory device. The 2nd sweep from 0 to −2 V indicated that the device remained in the high conductivity (ON) state even when the voltage was reduced to the range of 0 to −1.65 V. The device remained in the high conductivity (ON) state in subsequent sweeps, within the experimentally applied bias, in the positive and negative voltage directions (sweep 3 and sweep 4, respectively), and even after the power had been switched off for 30 h. Thus, the device based on PPE-a exhibited good retention of the ON state and is expected to be suitable for use in a WORM memory device.

Figure 17:
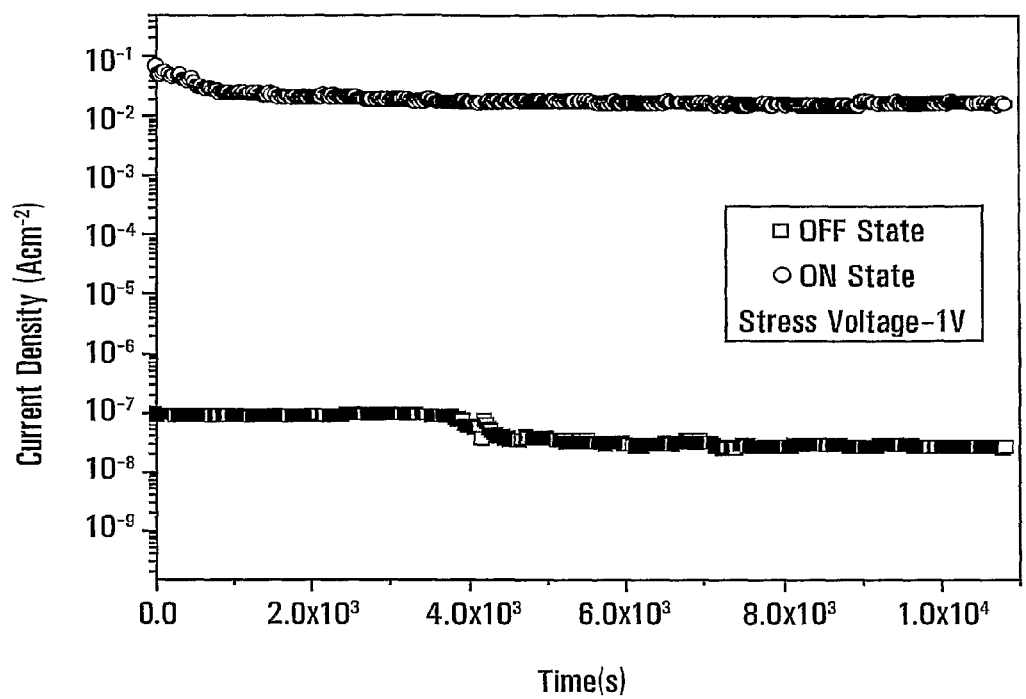
FIG. 17 is a data graph showing current density dependence on time in sample polymer materials.
Figure 18:
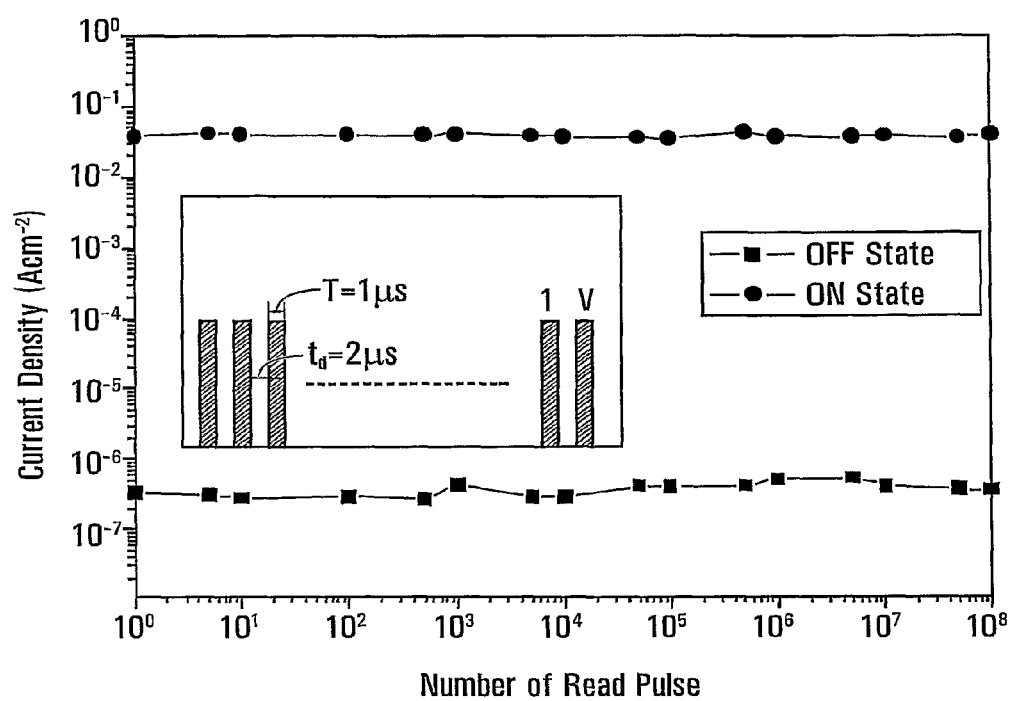
FIG. 18 is a data graph showing current density dependence on the number of read pulses in sample polymer materials.

The performance of the sample device based on PPE-a was evaluated under ambient conditions. Initially, the sample device was characterized by applying a stress of −1V in the ON or OFF state and was subsequently read every 30 s. The results obtained from the sample device are shown in FIGS. 17 and 18. The sample device showed relatively stable J values for both the ON and the OFF state, although a slight degradation in J value was observed for the ON state in the first 0.5 h and in the OFF state after 1 h. An ON/OFF current ratio above about $10^5$ was exhibited by the sample device. The sample device was subsequently characterized by reading the current using a −1V voltage pulse. The characteristics of representative measured voltage pulses are shown in the inset of FIG. 18, which indicate that the sample device was quite stable in both the OFF state and the ON state. The J values in both the ON state and OFF state did not change appreciably even after $10^8$ continuous read cycles. As can be appreciated, with a high ON/OFF current ratio of above about $10^5$, a low rate of read error may be achieved. The results also showed that the current density of the sample devices in both the ON and OFF states was unaffected by change in the size of the top Al electrode.

Figure 19:
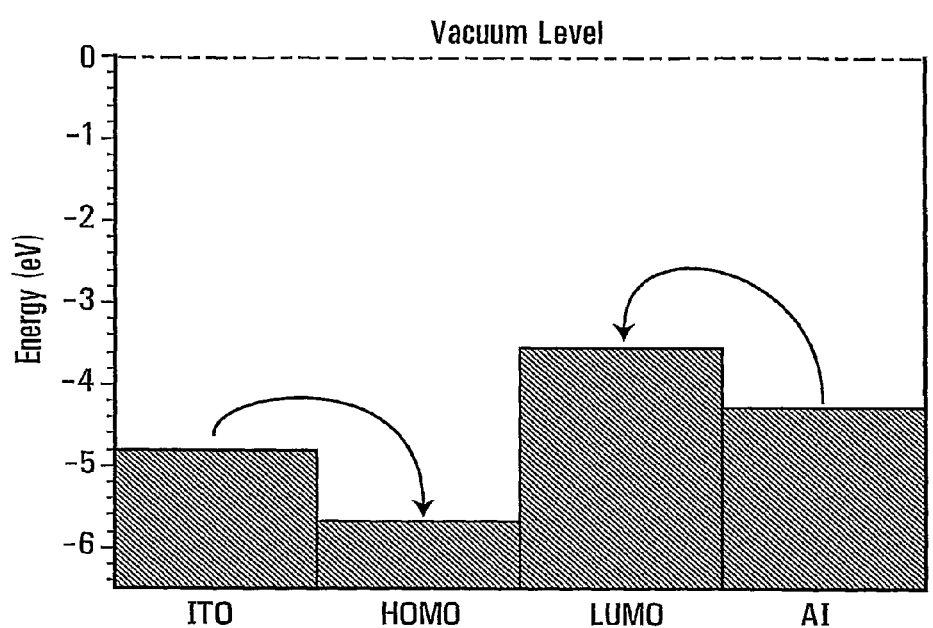
FIG. 19 is a bar graph showing the calculated energy levels for a sample polymer material.

Density function theory (DFT) calculations of PPE-a were performed using the Gaussian 03 program package at the DFT B3LYP/6-31G(d) level. The HOMO energy level of PPE-a was determined from the DFT calculation of the basic repeat unit of PPE-a to be about −5.46 eV. This value is comparable to that obtained from the CyV method (−5.67 eV). However, the LUMO energy level calculated from the DFT method for the basic repeat unit (−2.43 eV) differed substantially from that determined by CyV (−3.55 eV). The LUMO energy level decreased with the increased number of repeat units in PPE-a. The HOMO and LUMO energy levels of PPE-a along with the work functions (φ) of the ITO and Al electrodes are summarized in FIG. 19. The energy barrier between ITO and HOMO was 0.85 eV and that between Al and LUMO was 0.71 eV. The relatively lower energy barrier between Al and LUMO suggested that it would be easier for electron injection from Al to LUMO than hole injection from ITO to HOMO.

The π-conjugated PPEs are usually expected to be n-type (semi)conductors. The absence of sp³ hybridized carbon atoms in PPEs can lead to a situation in which overlapping p-orbitals of successive carbon atoms enable the delocalization of π electrons along the polymer backbones. However, the electrons in PPEs are filled in the valence band formed by the HOMOs. The empty conduction band formed by the LUMOs of PPEs is typical of semiconductors in their neutral, undoped state. Thus, PPEs are expected to exhibit high electrical conductivity after the addition of electrons to the polymers (reduction, n-doping). The molecular orbital of the basic unit of PPE-a is simulated using the Gaussian 03 program. The HOMO is located in the whole molecule, with a major part in the donor and a minor part in the acceptor, while separated by the nitro group which blocks the effective transition of electrons. Thus, it is expected that PPE-a would be in its low conductivity state at the beginning of scan from 0 to −1.65V. The LUMO is located in the acceptor. The LUMO2 is delocalized throughout the whole molecular which may serve as a pathway for the high conductivity state. At the turn-on voltage of −1.65 eV, PPE-a is expected to become n-doped, and the electrons are expected to be excited into LUMO2, bringing PPE-a into the high conductivity state.

The presence of a strong $NO_2$ electron acceptor is expected to be responsible for the maintenance of the high conductivity state. With more than 10 nitro groups in the present PPE-a (based on the observed molecular weight), the high conductivity state was observed to be sustained for more than 30 h. In comparison, OPE with one nitro group has a time constant of 910 s at 300K.

As now can be appreciated, the compounds and devices disclosed herein can be convenient to use in electronic devices and can provide certain improved properties as compared to OPE based devices.

When a list of items is given herein with an "or" before the last item, any of the listed items or any suitable combination of the listed items may be selected and used.

Of course, the above described embodiments are intended to be illustrative only and in no way limiting. The described embodiments are susceptible to many modifications of form, arrangement of parts, details and order of operation. The invention, rather, is intended to encompass all such modification within its scope, as defined by the claims.

What is claimed is:

1. A memory element comprising an electrode, and an active material formed from a compound that exhibits multiple conductive states, said compound comprising:
   a polymeric chain comprising a repeat unit repeated more than 5 times in said polymeric chain, said repeat unit comprising a first cyclic group and a second cyclic group conjugated to one another and a plurality of side groups each bonded to one of said first and second cyclic groups,
   wherein a side group bonded to said first cyclic group is an electron donor and a side group bonded to said second cyclic group is an electron acceptor, such that said compound is switchable between a first electrical conductive state and a second electrical conductive state by application of an electric field to said compound through said electrode, and
   wherein at least one of said plurality of side groups is selected so that said compound is soluble in an organic solvent.

2. The memory element of claim 1, wherein at least one of said electron donor and said electron acceptor is soluble in said organic solvent.

3. The memory element of claim 1, wherein said electron-donor comprises an amino (—$NH_2$), hydroxyl (—OH), alkyl amino (—NHR or —$NR_2$), alkyl (—R), alkoxy (—OR), ester (—COOR), aryl, thionyl, or carbazol group, or a derivative thereof, wherein R is an alkyl group comprising 1 to 20 carbon atoms.

4. The memory element of claim 1, wherein said electron-acceptor comprises a nitro, cyano, isocyano, sulfonyl, sulfinyl, halogenated alkyl, formyl, carboxyl, carbonyl, alkyloxycarbonyl, aryloxycarbonyl, 1-tetrazolyl, carbzmoyl, or sulfamoyl group.

5. The memory element of claim 1, wherein said compound comprises a copolymer, said copolymer comprising:
   a phenyl monomer comprising a substituent that is an electron-acceptor; and
   a phenyleneethynylene monomer comprising a side chain that is an alkyl or alkoxy group having 1 to 20 carbon atoms.

6. The memory element of claim 5, wherein said alkyl or alkoxy group has 1 to 13 carbon atoms.

7. The memory element of claim 5, wherein said side chain is an octyloxy, hexyl, octyl, 2-ethylhexyl, decyl, dodecyl, hexyloxy, 2-ethylhexyloxy, decyloxy, or dodecyloxy group.

8. The memory element of claim 5, wherein said phenyl monomer is a p-phenyl or an m-phenyl.

9. The memory element of claim 5, wherein said phenyl monomer further comprises an additional electron-donor.

10. The memory element of claim 5, wherein said copolymer has a number average molar weight (Mn) of more than 2000g/mol.

11. The memory element of claim 1, wherein said organic solvent is toluene, benzene, xylene, tetrahydrofuran, chloroform, or dichloromethane.

12. The memory element of claim 1, wherein said compound comprises a chain structure represented by

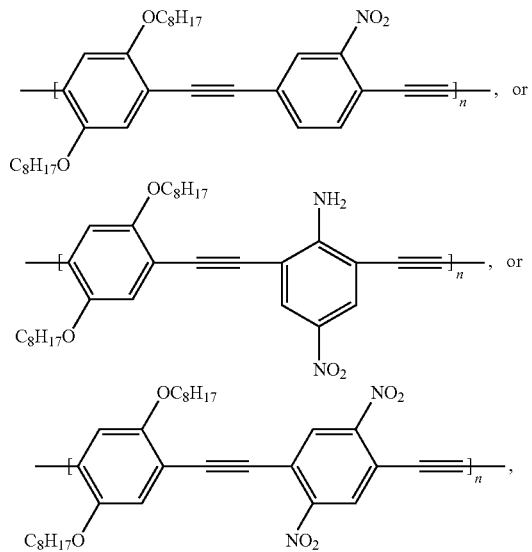

wherein n is an integer greater than 5.

13. The memory element of claim 12, wherein n is from 8 to 10.

14. The memory element of claim 1, comprising a film formed from said active material.

15. The memory element of claim 1, comprising one or more memory cells, at least one of said one or more memory cells comprising said active material.

16. An electronic device comprising the memory element of claim 1.

17. A method of forming the memory element of claim 1, comprising:
   dissolving said compound in an organic solvent to form a solution;
   applying said solution to a surface to form a layer of said solution on said surface; and
   removing said solvent from said layer of said solution to form a solid layer comprising said active material on said surface.

18. The electronic device of claim 16, comprising a storage device or a switching device.

19. The electronic device of claim 16, comprising a dynamic-random-access memory, non-volatile and rewritable flash memory, or write-once-read-many-times memory.

20. The electronic device of claim 16, comprising a cross point memory array, two-dimensional memory array, three-dimensional stacked memory array, two-terminal memory cell, or three-terminal memory cell.

* * * * *

UNITED STATES PATENT AND TRADEMARK OFFICE
CERTIFICATE OF CORRECTION

PATENT NO. : 8,758,935 B2
APPLICATION NO. : 13/148022
DATED : June 24, 2014
INVENTOR(S) : Qi-Dan Ling et al.

Page 1 of 1

It is certified that error appears in the above-identified patent and that said Letters Patent is hereby corrected as shown below:

In the Claims:

At column 22, in claim 12, in the third structure, $NH_2$ should replace $NO_2$ as shown below.

12. The memory element of claim 1, wherein said compound comprises a chain structure represented by

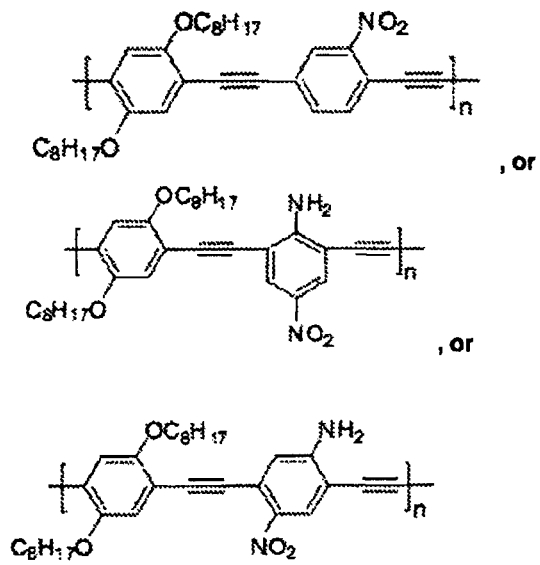

Signed and Sealed this
Fourteenth Day of October, 2014

Michelle K. Lee
*Deputy Director of the United States Patent and Trademark Office*